(12) United States Patent
Podkaminer et al.

(10) Patent No.: US 12,115,737 B2
(45) Date of Patent: Oct. 15, 2024

(54) THERMALLY CONDUCTIVE ARTICLES INCLUDING ENTANGLED OR ALIGNED FIBERS, METHODS OF MAKING SAME, AND BATTERY MODULES

(71) Applicant: 3M INNOVATIVE PROPERTIES COMPANY, St. Paul, MN (US)

(72) Inventors: Jacob P. Podkaminer, St. Paul, MN (US); Jens Eichler, Kaarst (DE); Peter J. Schneider, Neuss (DE); Sebastian Goris, Inver Grove Heights, MN (US); Victor Ho, St. Paul, MN (US); Joseph A. Dunbar, Woodbury, MN (US); Matthew T. Johnson, Woodbury, MN (US); Matthew H. Frey, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 88 days.

(21) Appl. No.: 17/793,109

(22) PCT Filed: Feb. 18, 2021

(86) PCT No.: PCT/IB2021/051398
§ 371 (c)(1),
(2) Date: Jul. 15, 2022

(87) PCT Pub. No.: WO2021/176290
PCT Pub. Date: Sep. 10, 2021

(65) Prior Publication Data
US 2023/0339194 A1    Oct. 26, 2023

Related U.S. Application Data

(60) Provisional application No. 62/984,479, filed on Mar. 3, 2020.

(51) Int. Cl.
*H01L 23/373* (2006.01)
*B29C 70/14* (2006.01)
(Continued)

(52) U.S. Cl.
CPC ............ *B29C 70/14* (2013.01); *B29C 70/545* (2013.01); *B29C 70/88* (2013.01);
(Continued)

(58) Field of Classification Search
None
See application file for complete search history.

(56) References Cited

U.S. PATENT DOCUMENTS

| 2,903,376 A | 9/1959 | Donahue et al. |
| 5,542,471 A | 8/1996 | Dickinson et al. |

(Continued)

FOREIGN PATENT DOCUMENTS

| CN | 103835067 A | 6/2014 |
| CN | 102992799 B | 1/2015 |

(Continued)

OTHER PUBLICATIONS

Gong, "Specialist Yarn and Fabric Structures: Developments and Applications—Chapter 12: Flocked Fabrics and Structures", Woodhead Publishing Limited, (2011), pp. 287-317.

(Continued)

*Primary Examiner* — Alexander S Thomas
(74) *Attorney, Agent, or Firm* — Adrian L. Pishko

(57) ABSTRACT

The present disclosure provides a thermally conductive article including a pad having first and second opposed major surfaces and a thickness therebetween. The thickness is formed of entangled thermally conductive fibers and at least a portion of the entangled thermally conductive fibers have at least one terminal end at the first opposed major surface, the opposed second major surface, or both. The pad (Continued)

is at least partially impregnated with a polymer. Another thermally conductive article is provided including a) a pad having first and second opposed major surfaces and a thickness therebetween; b) a first thermally conductive skin layer; and c) a second thermally conductive skin layer. The thickness of the pad is formed of aligned thermally conductive fibers, and at least a portion of the thermally conductive fibers have a terminal end at the first opposed major surface and the opposed second major surface. The first and second thermally conductive skin layers each include a polymeric matrix at least partially embedded in the terminal end of at least a portion of the thermally conductive fibers at the first and second major surfaces of the pad, respectively. Methods of making the thermally conductive articles are also provided.

12 Claims, 13 Drawing Sheets

(51) Int. Cl.
  B29C 70/54 (2006.01)
  B29C 70/88 (2006.01)
  B29L 7/00 (2006.01)

(52) U.S. Cl.
  CPC ............. *B29K 2995/0013* (2013.01); *B29K 2995/0046* (2013.01); *B29K 2995/0051* (2013.01); *B29L 2007/008* (2013.01); *H01L 23/3733* (2013.01); *H01L 23/3737* (2013.01)

(56) References Cited

U.S. PATENT DOCUMENTS

| | | | |
|---|---|---|---|
| 6,013,376 A | 1/2000 | Yenni, Jr. et al. |
| 6,280,814 B1 | 8/2001 | Offermann et al. |
| 6,713,151 B1 | 3/2004 | Dean et al. |
| 6,794,030 B1 | 9/2004 | Okada et al. |
| 6,913,075 B1 | 7/2005 | Knowles et al. |
| 7,144,624 B2 | 12/2006 | Knowles et al. |
| 7,229,683 B2 | 6/2007 | Fischer et al. |
| 7,851,534 B2 | 12/2010 | Yoda et al. |
| 8,357,256 B2 | 1/2013 | Dumas et al. |
| 9,308,695 B2 | 4/2016 | Usui et al. |
| 9,543,552 B2 | 1/2017 | Haspel et al. |
| 9,705,162 B2 | 7/2017 | Geise et al. |
| 9,833,772 B2 | 12/2017 | Cola et al. |
| 2003/0178174 A1 | 9/2003 | Belady et al. |
| 2004/0117930 A1 | 6/2004 | Townley et al. |
| 2009/0130403 A1 | 5/2009 | Sikkel et al. |
| 2009/0149100 A1 | 6/2009 | Goering et al. |
| 2011/0031435 A1 | 2/2011 | Yoda et al. |
| 2011/0245373 A1 | 10/2011 | Yoda et al. |
| 2012/0219839 A1 | 8/2012 | Kritzer et al. |
| 2014/0303306 A1 | 10/2014 | Kajiwara et al. |
| 2016/0007453 A1 | 1/2016 | Kawate |
| 2016/0333232 A1 | 11/2016 | Choi et al. |
| 2017/0108297 A1 | 4/2017 | Knowles et al. |
| 2018/0215964 A1 | 8/2018 | Wieneke et al. |
| 2019/0067760 A1 | 2/2019 | Son et al. |
| 2019/0211485 A1 | 7/2019 | Inoue et al. |
| 2019/0217585 A1 | 7/2019 | Takamatsu et al. |
| 2019/0221495 A1 | 7/2019 | Divakar et al. |
| 2019/0292349 A1 | 9/2019 | Ito et al. |
| 2019/0367719 A1 | 12/2019 | Nakane et al. |

FOREIGN PATENT DOCUMENTS

| | | |
|---|---|---|
| CN | 107285189 B | 9/2018 |
| DE | 19635214 C2 | 8/1999 |
| DE | 102009052508 A1 | 5/2011 |
| DE | 102013203966 A1 | 9/2014 |
| DE | 102015210892 A1 | 12/2016 |
| DE | 102016216050 A1 | 3/2018 |
| DE | 102017203096 A1 | 8/2018 |
| EP | 0566093 A1 | 10/1993 |
| EP | 1 865 553 A2 | 12/2007 |
| EP | 2427038 A1 | 3/2012 |
| JP | 05044149 A | 2/1993 |
| JP | 10294580 A | 11/1998 |
| JP | 11107187 A | 4/1999 |
| JP | 2004010836 A | 1/2004 |
| JP | 2005344968 A | 12/2005 |
| JP | 2006002429 A | 1/2006 |
| JP | 2007266518 A | 10/2007 |
| JP | 2010050240 A | 3/2010 |
| JP | 2010126685 A | 6/2010 |
| JP | 2014150161 A | 8/2014 |
| JP | 2016027221 A | 2/2016 |
| JP | 2021034589 A | 3/2021 |
| KR | 20060080690 A | 7/2006 |
| RU | 2065846 C1 | 8/1996 |
| WO | 1994016164 A1 | 7/1994 |
| WO | 2010101723 A2 | 9/2010 |
| WO | 2014133991 A1 | 9/2014 |
| WO | 2016/006614 A1 | 1/2016 |
| WO | 2018005501 A1 | 1/2018 |
| WO | 2020013268 A1 | 1/2020 |
| WO | 2020230060 A1 | 11/2020 |

OTHER PUBLICATIONS

International Search Report for PCT International Application No. PCT/IB2021/051398, mailed on May 11, 2021, 4 pages.
Ji, "Thermal conductive and flexible silastic composite based on a hierarchical framework of aligned carbon fibers-carbon nanotubes", Carbon, May 2018, vol. 131, pp. 149-159.
Sun, "Improvement of out-of-plane thermal conductivity of composite laminate by electrostatic flocking", Materials and Design, Apr. 2018, vol. 144, No. 15 pp. 263-270.
Uetani, "Elastomeric Thermal Interface Materials with High Through-Plane Thermal Conductivity from Carbon Fiber Fillers Vertically Aligned by Electrostatic Flocking", Advanced Materials, Sep. 2014, vol. 26, No. 33, pp. 5857-5862.
Yu, "Fabrication of aligned carbon-fiber/polymer TIMs using electrostatic flocking method", Journal of Materials Science: Materials in Electronics, Jun. 2019, vol. 30, No. 11, pp. 10233-10243.

```
┌─────────────────────────────────────────────────────────┐
│  Aligning a plurality of thermally conductive fibers    │
│  having a first terminal end, a length, and an opposing │
│  second terminal end, aligned such that at least a      │
│  portion of the lengths of the thermally conductive     │
│  fibers are parallel ± 20 degrees to each other         │
│                         1210                            │
└─────────────────────────────────────────────────────────┘
                             │
                             ▼
┌─────────────────────────────────────────────────────────┐
│  Embedding a thermally conductive polymeric material    │
│  or a thermally conductive polymerizable material in    │
│  the first terminal end of at least a portion of the    │
│  thermally conductive fibers                            │
│                         1220                            │
└─────────────────────────────────────────────────────────┘
                             │
                             ▼
┌─────────────────────────────────────────────────────────┐
│  Drying the polymeric material or polymerizing the      │
│  polymerizable material                                 │
│                         1230                            │
└─────────────────────────────────────────────────────────┘
                             │
                             ▼
┌─────────────────────────────────────────────────────────┐
│  Embedding a thermally conductive polymeric material    │
│  or a thermally conductive polymerizable material in    │
│  the second terminal end of at least a portion of the   │
│  thermally conductive fibers                            │
│                         1240                            │
└─────────────────────────────────────────────────────────┘
                             │
                             ▼
┌─────────────────────────────────────────────────────────┐
│  Drying the polymeric material or polymerizing the      │
│  polymerizable material                                 │
│                         1250                            │
└─────────────────────────────────────────────────────────┘
```

*FIG. 12*

THERMALLY CONDUCTIVE ARTICLES INCLUDING ENTANGLED OR ALIGNED FIBERS, METHODS OF MAKING SAME, AND BATTERY MODULES

BACKGROUND

Batteries can generate substantial amounts of heat during charge and discharge, but the temperature needs to be controlled to prevent thermal runway or degradation of performance. Thermal Interface Materials (TIMs) serve as a thermal bridge between the batteries and the cooling system in order to dissipate the heat away from the batteries into the cooling system. TIMs can come in different form factors but they most commonly comprise an organic matrix (e.g., acrylic, silicone, epoxy, oil) and thermally conductive filler particles (e.g., particles of ceramic, carbon, or metal). In these cases, the thermally conductive particles are randomly distributed in an organic matrix which serves as a binder and largely dictates the final mechanical properties of the TIM.

BRIEF DESCRIPTION OF DRAWINGS

FIG. 12 is a flow chart of another exemplary method of making a thermally conductive article.

Figure 1A:
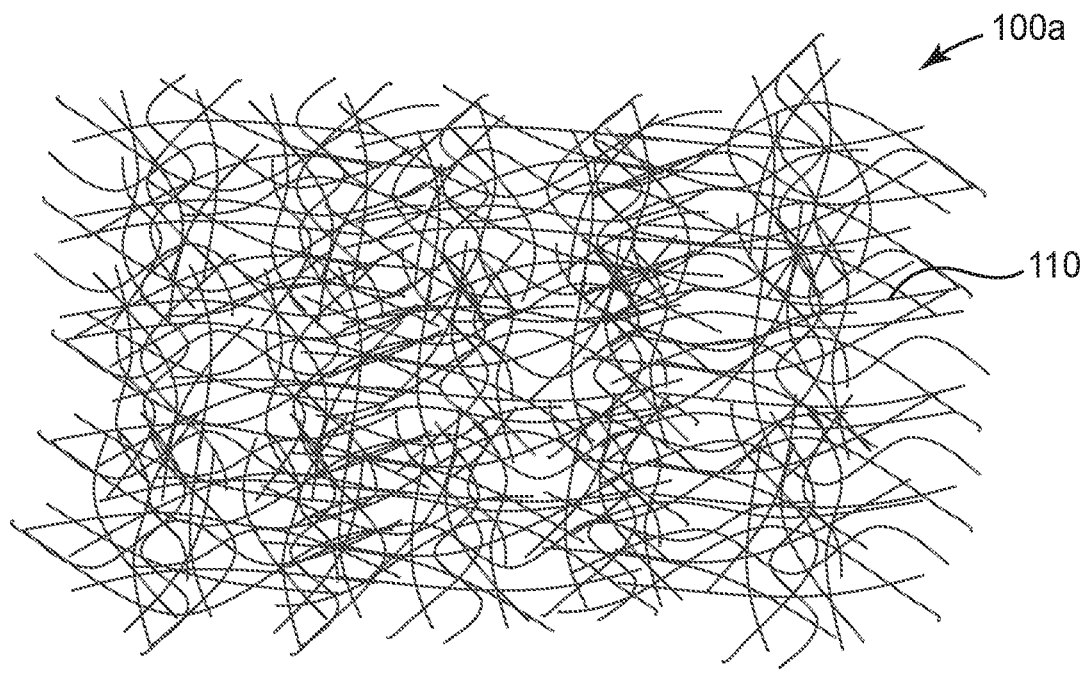
FIG. 1A is a schematic top view of a nonwoven web for use in making an exemplary article, preparable according to the present disclosure.
Figure 1B:
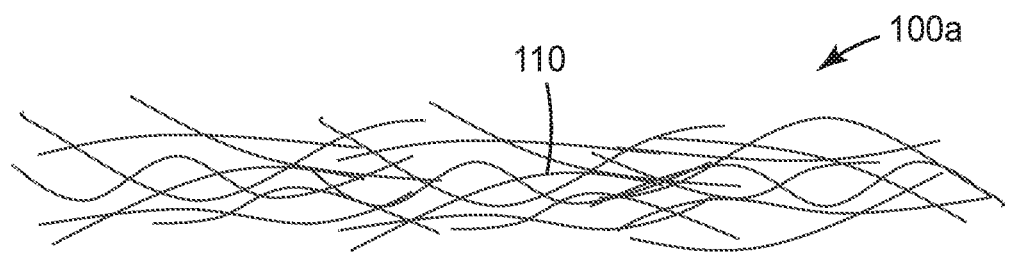
FIG. 1B is a schematic side view of the nonwoven web of FIG. 1A.

Repeated use of reference characters in the specification and drawings is intended to represent the same or analogous features or elements of the disclosure. It should be understood that numerous other modifications and embodiments can be devised by those skilled in the art, which fall within the scope and spirit of the principles of the disclosure. The figures may not be drawn to scale.

DETAILED DESCRIPTION

Thermal management plays an important role in many electronics applications such as, for example, electric vehicle (EV) battery assembly, power electronics, electronic packaging, LED, solar cells, electric grid, and the like. Certain thermally conductive materials (e.g., adhesives) may be an attractive option for these applications due to good electrical insulative properties, feasibility in processing for integrated parts or complex geometries, and good conformability/wettability to different surfaces, especially the ability to efficiently dissipate the heat away while having good adhesion to different substrates for assembly.

Regarding applications in EV battery assemblies, currently, one such application that utilizes a thermally conductive material is the gap filler application. Generally, requirements for the gap filler application include a thermal interface material (TIM) that has a high thermal conductivity, low density, and high compressibility. However, to achieve high thermal conductivity, typically, a large amount of inorganic thermally conductive filler is added to the composition. The high loading of thermally conductive fillers, however, has a deleterious impact on density, compressibility, and toughness. Thermally conductive articles according to the present disclosure advantageously employ substantially aligned thermally conductive fibers such as copper, aluminum, or graphite. In some embodiments, the thermally conductive articles also include void space in suitable amounts (i.e., void volume fraction or void volume percentage) and at appropriate locations in order to attain simultaneously high values of effective thermal conductivity and compressibility.

The terms "a", "an", "the", "at least one", and "one or more" are used interchangeably.

The term "and/or" means one or both such as in the expression A and/or B refers to A alone, B alone, or to both A and B.

The term "essentially" means 95% or more.

The term "convolute" means rolled upon itself as, for example, a jelly roll or a roll of tape.

The terms "cure" and "curable" refer to joining polymer chains together by covalent chemical bonds, usually via crosslinking molecules or groups, to form a network polymer. Therefore, in this disclosure the terms "cured" and "crosslinked" may be used interchangeably. A cured or crosslinked polymer is generally characterized by insolubility, but may be swellable in the presence of an appropriate solvent.

The term "entangled" with respect to fibers means that a plurality of fibers are tortuously interlocked with their companion fibers (e.g., randomly, for example as nonwoven, or woven or knitted). The fibers are not necessarily fused (e.g., melted) or bonded together; rather, the flexibility of the fibers, as determined by their composition, denier, crimp index, and other properties, allow essentially interlocking of the fibers, greatly increasing the strength of a resulting web comprising such entangled fibers.

It has unexpectedly been discovered that it is possible to prepare thermally conductive articles that provide advantageous thermal conductivity and compressibility properties.

In a first aspect, a thermally conductive article is provided. The thermally conductive article comprises a pad having first and second opposed major surfaces and a thickness therebetween, wherein the thickness is formed of a plurality of entangled thermally conductive fibers and at least a portion of the entangled thermally conductive fibers have at least one terminal end at the first opposed major surface, the opposed second major surface, or both; and wherein the pad is at least partially impregnated with a polymer.

In a second aspect, a method of making a thermally conductive article is provided. The method of making a thermally conductive article comprises:
 a) obtaining at least one nonwoven web comprising a plurality of entangled thermally conductive fibers, the nonwoven web having a first major surface and an opposed second major surface;
 b) impregnating the at least one nonwoven web with a polymeric composition or a polymerizable composition;
 c) drying the polymeric composition or polymerizing the polymerizable composition; either
 d1) rolling the first major surface of the nonwoven web against the second major surface of the nonwoven web to form an elongated convolute member having a first end and an opposed second end; and
 e1) slicing a pad from the first end of the elongated convolute member; or
 d2) adhering a stack of a plurality of coated nonwoven webs together; and
 e2) slicing a pad from a first end of the stack of the plurality of nonwoven webs,
 thereby forming a thermally conductive article comprising a pad having first and second opposed major surfaces and a thickness therebetween, wherein the thickness is formed of a plurality of entangled thermally conductive fibers and at least a portion of the entangled thermally conductive fibers have at least one terminal end at the first opposed major surface, the opposed second major surface, or both; and wherein the pad is at least partially impregnated with a polymer.

The below disclosure relates to both the first and second aspects.

The thermally conductive article of the first aspect of the present disclosure comprises an entangled fiber (e.g., nonwoven) web that functions as a self-supporting skeleton, and the polymer serves to at least partially adhere thermally conductive fibers to one another, contributing to the mechanical properties of the article. As a result, continuous thermal pathways through the thickness (e.g., z-axis direction, also referred to herein as the thickness direction, which is the shortest axis) of the pad are present, which permit the use of far less of the thermally conductive material than prior thermally conductive composite articles, while still achieving similar thermal conductivity values. Further, air may be caused to be entrained in the thermally conductive article during processing and can be a significant component of the final pad, contributing to the very low density and high compressibility observed. Therefore, low density, conformability, and appreciable thermal conductivity may all be achievable in one solution, in contrast to traditional TIMs. In this first aspect, it was discovered herein that advantageous combinations of thermal conductivity, compressibility, and compressive strain recovery (also referred to herein as spring back) for the article (e.g., a thermally conductive pad) could be achieved by combining the design elements of i) entanglement (e.g., random entanglement) of thermally conductive fibers and void space within the thickness of the article and ii) thermally conductive fiber termini at one or both major surfaces of the article (e.g., the article includes, for at least some thermally conductive fibers, respective first and second thermally conductive fiber termini at the first and second major surfaces of the article, respectively). The articles may also be at least partially impregnated with a polymer. What is meant by at least partially impregnated with a polymer is that at least some of the space between thermally conductive fibers is occupied by a polymer. Examples of at least some of the space between thermally conductive fibers being occupied by a polymer include: a polymer coating applied to the thermally conductive fibers; a polymer located at junctions (also referred to herein as points of contact) between thermally conductive fibers; and a polymer present as inclusions that fill at least a portion of spaces between the thermally conductive fibers. In some embodiments of the first aspect, the article (e.g., thermally conductive pad) is impregnated with a polymer in the form of a polymer coating applied to the thermally conductive fibers and the polymer located at junctions between thermally conductive fibers. None of the aforementioned forms of the article comprising thermally conductive fibers and impregnated with a polymer in the thickness of the article are incompatible with the presence also of void space in the thickness of the article. Stated differently, articles of the first aspect may include entangled (e.g., randomly entangled) thermally conductive fibers in their thickness, along with an impregnated polymer and void space in the thickness of the article. Indeed, the coexistence of these three elements are preferred, along with termini of the thermally conductive fiber located at the major surfaces of the article.

Referring to FIG. 1, a schematic top view is provided of a nonwoven web 100*a* for use in making an exemplary article, comprising a plurality of entangled thermally conductive fibers 110. The fibers in the x-axis (length direction) and y-axis (width direction) are visible in this top view. FIG. 1B shows a schematic side view of the nonwoven web 100*a* of FIG. 1A comprising the entangled thermally conductive fibers 110. The fibers in the x-axis (length direction) and the z-axis (height direction) are visible in this side view. Given that fibers of the nonwoven web tend to have a predominately preferred in-plane (e.g., x-y plane) orientation, albeit randomly oriented in-plane, a method was established to reorient the fibers through the plane of a finished article (e.g., thermally conductive pad) to achieve the thermal benefits of the thermally conductive fibers. This was achieved by one of two different techniques. In a first technique, the procedure begins by rolling up an entangled thermally conductive fiber web (e.g., non-woven web) and then slicing the resulting roll at an angle to the rolling axis (e.g., 90 degrees) to a desired thickness, which results in in an article with fibers orientated through plane, in-plane, and various degrees between, which is beneficial for fiber to fiber connectivity as well as top surface to bottom surface continuous networks. In a second technique, the procedure begins by adhering a stack of entangled thermally conductive fiber webs (e.g., nonwoven webs) together and then slicing a thermally conductive pad from a first end of the stack of the webs, the pad having a banded structure derived from the original stack of webs.

Figure 1C:
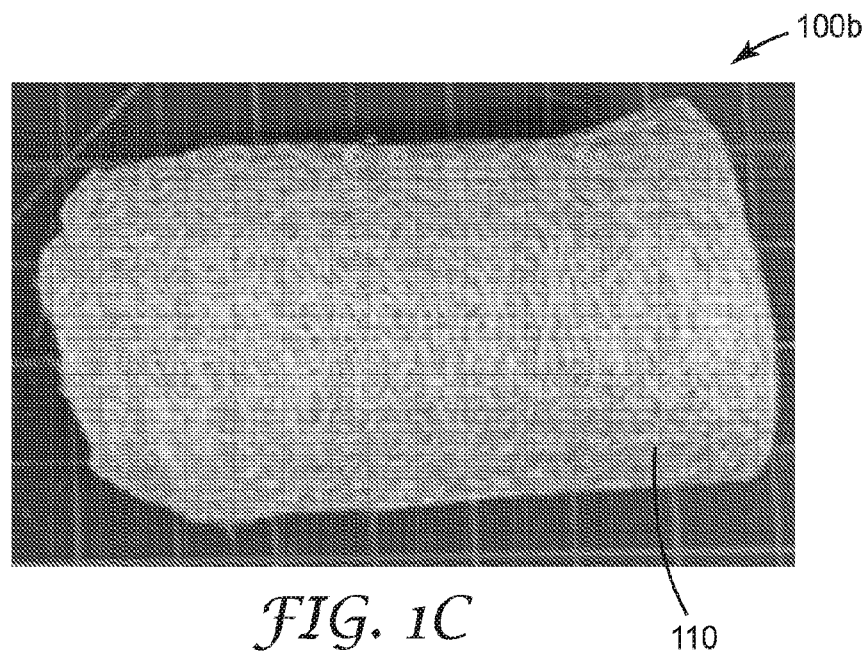
FIG. 1C is a perspective view of a convolute member for use in making an exemplary article, preparable according to the present disclosure.
Figure 1D:
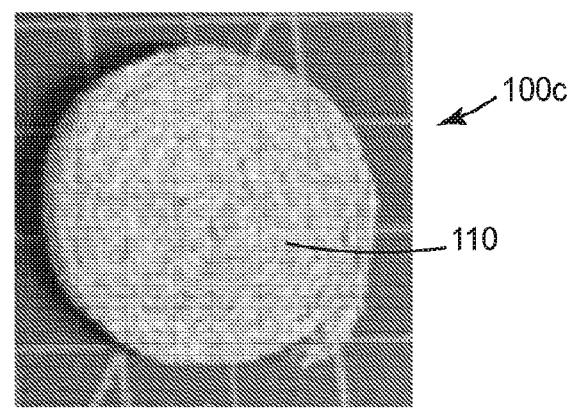
FIG. 1D is a perspective view of an exemplary article according to the present disclosure.

Referring to FIG. 1C, with respect to the first technique, a convolute member 100b is shown, for use in making an exemplary article. The convolute member 100b was prepared by rolling up a nonwoven web of thermally conductive fibers 110 that was at least partially infused with a polymer. FIG. 1D is a perspective view of an exemplary article 100c, following slicing a pad off the convolute member 100b of FIG. 1C. In select embodiments according to the first technique, the pad is a convolute layer.

Figure 1E:
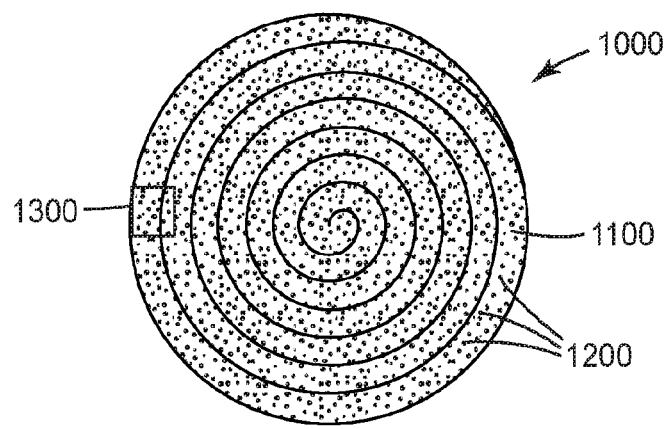
FIG. 1E is a schematic top view of another exemplary article, preparable according to the present disclosure.

Advantageously, such methods of forming a thermally conductive article results in at least a portion of the entangled thermally conductive fibers having a terminal end disposed at at least one of the first opposed major surface or the opposed second major surface. For instance, FIG. 1E is a schematic top view of an exemplary article 1000 derived from the first technique, having a coiled up nonwoven web 1100 and a plurality of terminal ends 1200 of thermally conductive fibers shown on one major surface of the article 1000. In select embodiments, one or both of the first and second opposed major surfaces includes an areal density of thermally conductive fiber termini of at least 5 per square millimeter, at least 7, at least 10, at least 15, or at least 20 per square millimeter, e.g., the fiber termini 1200 shown in the area 1300 of the article 1000 of FIG. 1E. While not limited in terms of a maximum areal density of fiber termini, the major surface or surfaces of articles according to the present disclosure, including the first aspect, may have up to 100 thermally conductive fiber termini per square millimeter, e.g., the fiber termini 1200 shown in the area 1300 of the article 1000 of FIG. 1E or the fiber termini 5200 shown in the area 5400 of the article 5000 of FIG. 5. In some embodiments, the first major surface or the second major surface or both first and second major surfaces of the article (e.g., thermally conductive pad) includes an areal density of fiber termini of between 1 and 100 per square millimeter, in some embodiments between 5 and 50 per square millimeter, and in yet other embodiments between 7 and 20 per square millimeter, e.g., the fiber termini 1200 shown in the area 1300 of the article 1000 of FIG. 1E. Preferably, at least a portion of the thermally conductive fibers have a terminal end at each of the first opposed major surface and the opposed second major surface of the pad. In some embodiments, at least 25%, at least 30%, at least 35%, or at least 40%, and up to 75%, of the thermally conductive fibers have a terminal end at each of the first opposed major surface and the opposed second major surface of the pad.

Figure 2:
FIG. 2 is a schematic side view of entangled continuous fibers of an exemplary article, preparable according to the present disclosure.

Referring to FIG. 2, a schematic side view is provided of entangled fibers 2200 of an exemplary article 2000, in which a portion of the thermally conductive fiber termini 2250 at one or both of the opposing major surfaces of the article 2000. At least some of the fibers provide a continuous thermally conductive pathway from one major surface of a pad to the opposing major surface of a pad provided by a single thermally conductive fiber. At least some of the fibers provide a connected pathway of two fibers that touch each other to achieve a thermally conductive pathway from one major surface of a pad to the opposing major surface of a pad. The thermally conductive fibers may take circuitous routes between the opposing major surfaces of the pad, for instance as seen in FIG. 2. In some embodiments of thermally conductive articles described herein, both continuous thermally conductive pathways and connected thermally conductive pathways are provided from one major surface of a pad to the opposing major surface of a pad. In select embodiments, just continuous thermally conductive pathways are provided from one major surface of a pad to the opposing major surface of a pad.

Figure 3:
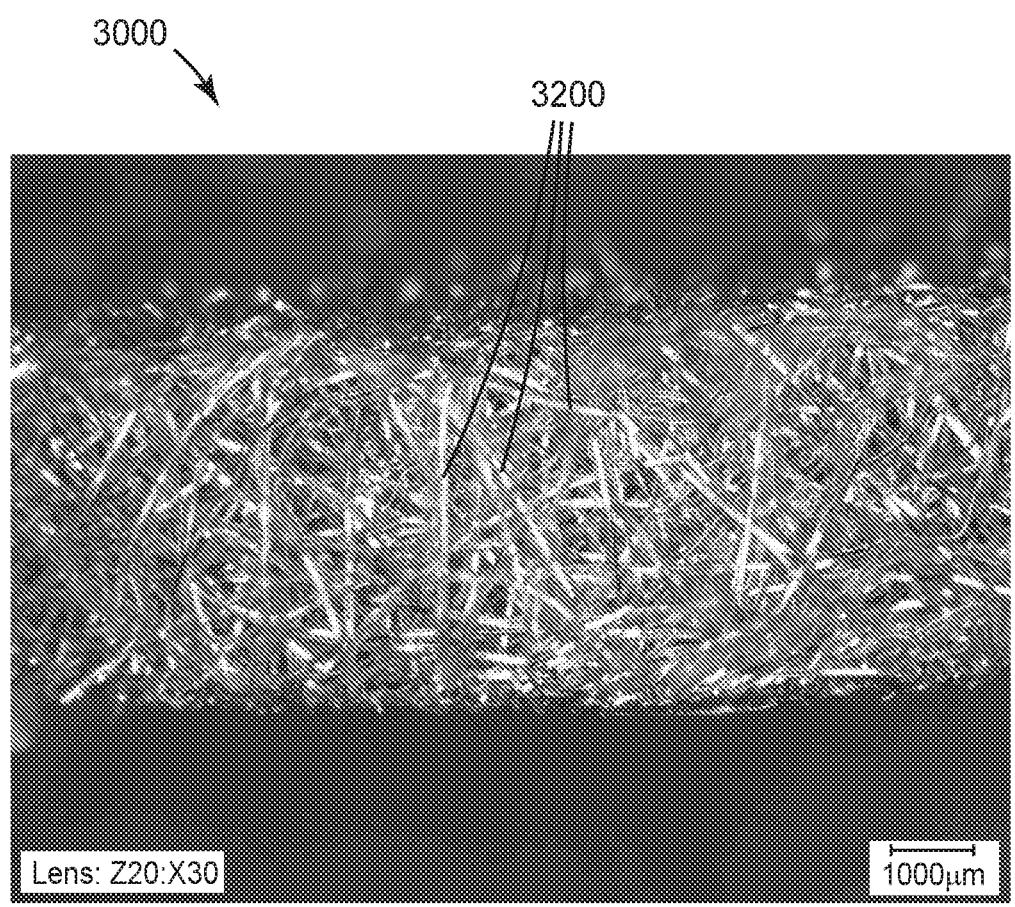
FIG. 3 is an optical micrograph showing a side view of a further exemplary article, preparable according to the present disclosure.

Referring to FIG. 3, an optical micrograph is provided showing a side view of an exemplary article 3000, comprising a plurality of continuous thermally conductive fibers 3200. FIG. 3 illustrates how, in practice, there is a wide variation in the directions and angles of the individual thermally conductive articles with respect to each other.

Figure 4A:
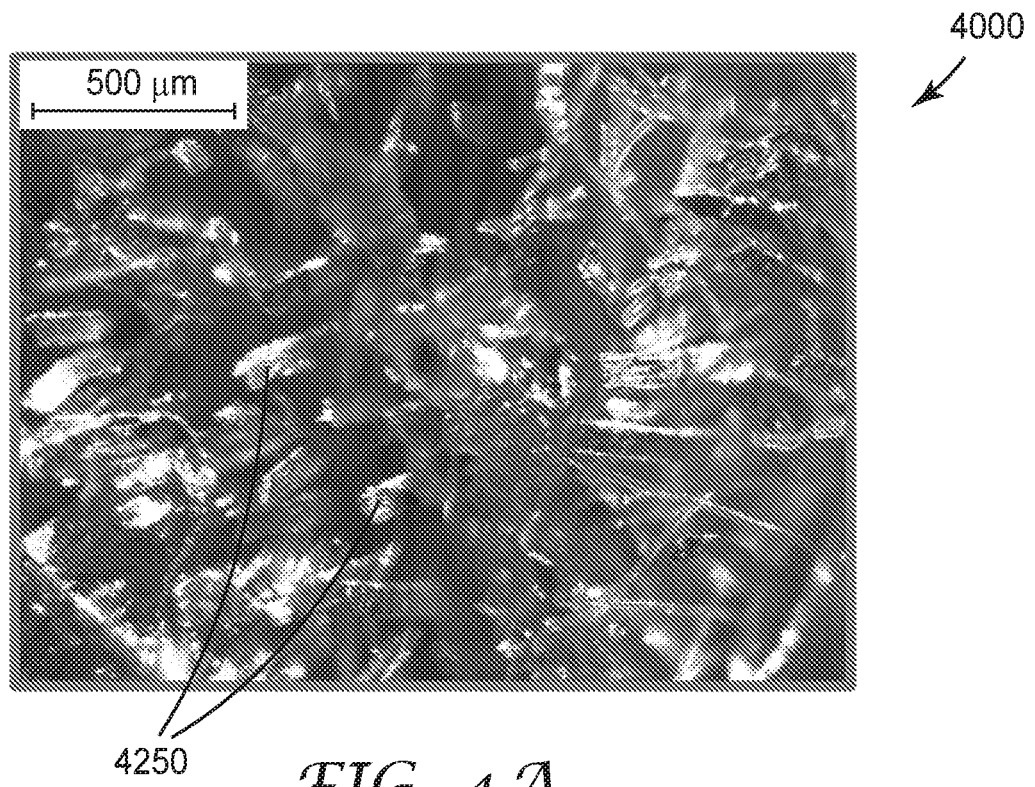
FIG. 4A is an optical micrograph showing a top view of an additional exemplary article, preparable according to the present disclosure.
Figure 4B:
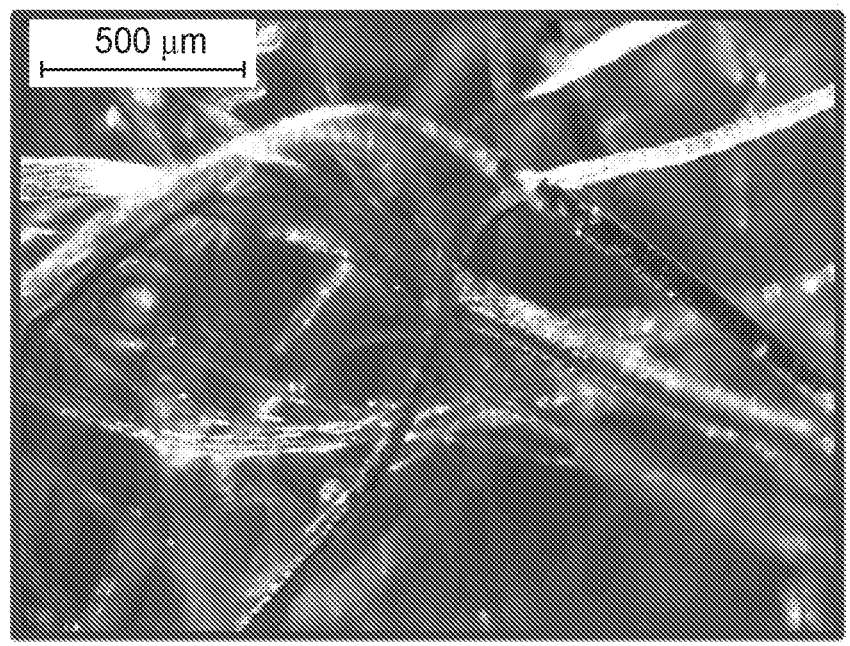
FIG. 4B is an optical micrograph showing a top view of a comparative article.

FIG. 4A is an optical micrograph showing a top view of an exemplary article 4000, on which numerous thermally conductive fibers terminate at the top of the major surface, a couple of which are indicated as fiber termini 4250. Over an examined area of 3.4 square millimeters, 34 termini were found (i.e., an areal density of fiber termini of 10 per square millimeter). In contrast, FIG. 4B is an optical micrograph showing a top view of a comparative article comprising a nonwoven web having a structure similar to that of FIG. 1A. No fibers in FIG. 4B are seen to terminate at the top of the major surface of the nonwoven web, due to the preferred in-plane fiber orientation.

Figure 5:
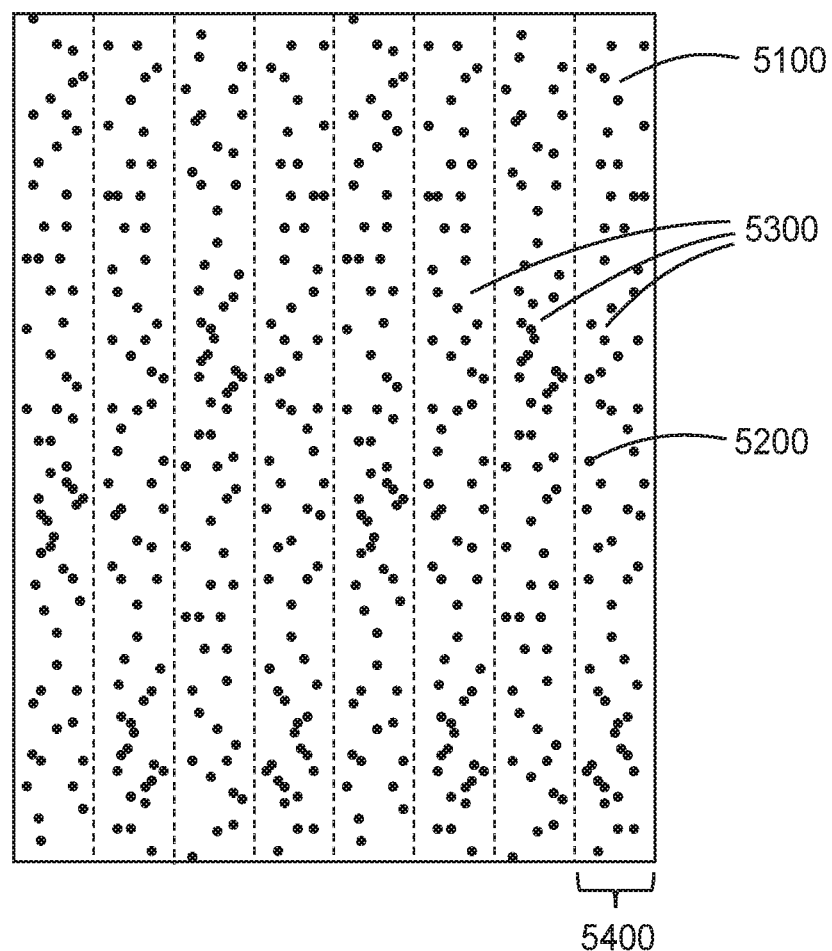
FIG. 5 is a schematic side view of yet another exemplary article, preparable according to the present disclosure.

With regard to the second technique, FIG. 5 is a schematic top view of an exemplary article 5000 having a banded structure comprising bands 5300 of nonwoven web 5100 and a plurality of terminal ends 5200 of thermally conductive fibers shown on one major surface of the article 5000. In select embodiments, one or both of the first and second opposed major surfaces includes an areal density of thermally conductive fiber termini of at least 5 per square millimeter, at least 7, at least 10, at least 15, or at least 20 per square millimeter. While not limited in terms of a maximum areal density of fiber termini, the major surface or surfaces of articles according to the present disclosure, including the first aspect, may have up to 100 thermally conductive fiber termini per square millimeter, e.g., the fiber termini 5200 shown in the area 5400 of the article 5000 of FIG. 5. In some embodiments, the first major surface or the second major surface or both first and second major surfaces of the article (e.g., thermally conductive pad) includes an areal density of fiber termini of between 1 and 100 per square millimeter, in some embodiments between 5 and 50 per square millimeter, and in yet other embodiments between 7 and 20 per square millimeter, e.g., the fiber termini 5200 shown in the area 5400 of the article 5000 of FIG. 5. Preferably, at least a portion of the thermally conductive fibers have a terminal end at each of the first opposed major surface and the opposed second major surface of the pad. In some embodiments, at least 25%, at least 30%, at least 35%, or at least 40%, and up to 75%, of the thermally conductive fibers have a terminal end at each of the first opposed major surface and the opposed second major surface of the pad.

Figure 6:
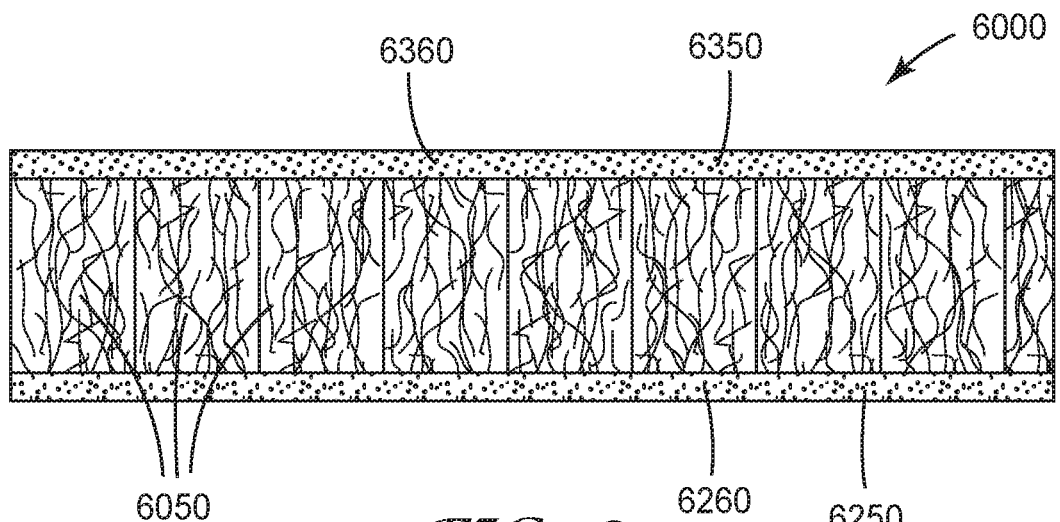
FIG. 6 is a schematic side view of a still further exemplary article, preparable according to the present disclosure.

Referring to FIG. 6, a schematic side view of an exemplary article 6000 is provided preparable according to the second technique mentioned above of adhering a stack of nonwoven webs together and slicing a pad from a first end of the stack of the nonwoven webs. The article 6000 comprises a plurality of thermally conductive bands 6050 attached to each other, each band being characterized by its respective population of thermally conductive fibers, as determined by the respective nonwoven web that had been stacked, before slicing the pad from the stack of nonwoven webs. Typically, the nonwoven webs have a structure similar to that of FIG. 1A, thus once stacked and sliced at an end of the stack, provides a pad having a plurality of portions of nonwoven ends essentially standing on end to provide orientation of some thermally conductive fibers parallel to the thickness direction (e.g., z-axis) of the pad.

Figure 7:
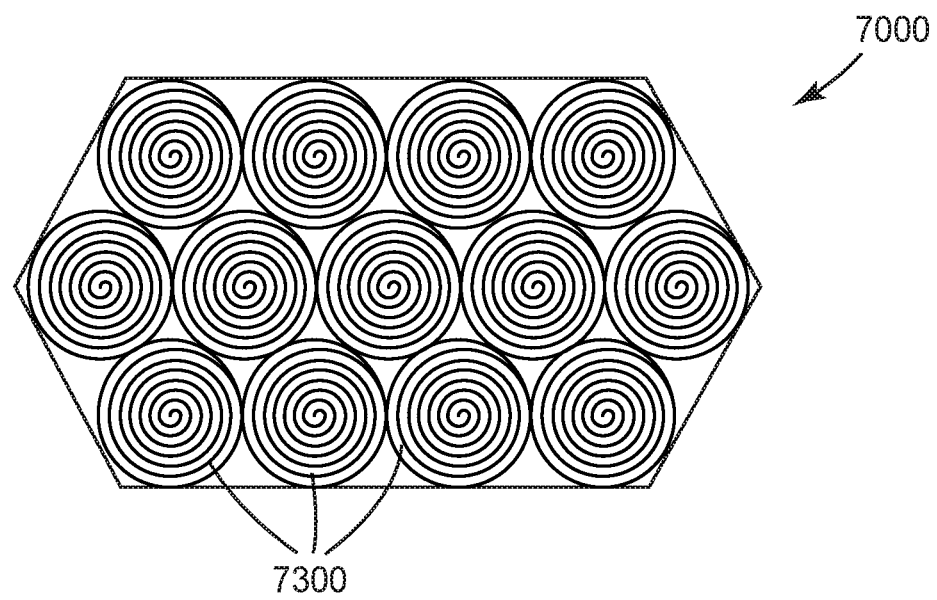
FIG. 7 is a schematic top view of an exemplary article comprising an array of pads, preparable according to the present disclosure.

In the embodiment illustrated in FIG. 6, the article 6000 further comprises an optional first skin layer 6250 attached to a first major surface of the attached pads 6050, as well as an optional second skin layer 6350 attached to a second major surface of the attached pads 6050. Each of the first skin layer 6250 and the second skin layer 6350 of the article 6000 is a composite comprising a polymer and at least one thermally conductive particle 6260 and 6360, respectively. One or more of such skin layers may be incorporated in any of the thermally conductive articles described herein, e.g., also articles in which the pad is a convolute layer. In some embodiments that include skin layers, the pad includes at least some thermally conductive fibers that extend into the first skin layer, at least some thermally conductive fibers that extend into the second skin layer, or both (not shown). In some embodiments that include skin layers, the pad includes at least some thermally conductive fibers that extend with a first terminus into the first skin layer and extend with a second terminus into the second skin layer (not shown). In yet other embodiments that include skin layers, the pad includes at least some thermally conductive fibers that extend completely through the first skin layer to reach a first major surface of the pad, at least some thermally conductive fibers that extend completely through the second skin layer to reach a second major surface of the pad, or both. In yet other embodiments that include skin layers, the pad includes at least some of the thermally conductive fibers that extend with a first terminus completely through the first skin layer to reach a first major surface of the pad and extend with a second terminus completely through the second skin layer to reach a second major surface of the pad (not shown), thus such a pad provides a continuous thermally conductive path from the first major surface to the second major surface. In some embodiments that do not include optional skin layers, the pad includes thermally conductive fibers that extend with a first terminus to reach a first major surface of the pad and extend with a second terminus to reach a second major surface of the pad (not shown), thus such a pad provides a continuous thermally conductive path from the first major surface to the second major surface Optionally, the thermally conductive article comprises an array of pads. For example, FIG. 7 is a schematic top view of an array of pads each in the form of a convolute layer 7300 tiled to form the thermally conductive article 7000. The array of pads could take any shape wherein there are open spaces between convolute layers or such that they are compressed in-plane to fill all void space between pads to form a complete sheet. Alternatively, the pads may have a form of a stack of nonwoven webs such as illustrated in FIG. 6, or some combination of pad structures.

Advantageously, thermally conductive articles according to the present disclosure are low density articles, which means that they require less material input than higher density articles. The thermally conductive article typically exhibits a density of less than 1.00 gram per cubic centimeter (g/cc), 0.90 g/cc or less, 0.80 g/cc or less, 0.70 g/cc or less, 0.60 g/cc or less, 0.50 g/cc or less, 0.40 g/cc or less, 0.30 g/cc or less, or 0.20 g/cc or less; and 0.05 g/cc or greater. A factor in achieving such low density thermally conductive articles is the presence of a substantial amount of void volume (e.g., containing ambient air or a selected gas) throughout the pad or within a thickness of the pad (e.g., between skin layers if present). In any embodiment, for a thickness of the pad (e.g., between skin layers if present, or for the entirety of the cross-section of a pad) the pad may have a void volume fraction of at least 10%, at least 20%, at least 30%, at least 40%, at least 50%, at least 60%, at least 70%, at least 80%, at least 90%; at least 92%; at least 95%, or at least 97%; and less than 100% of void volume fraction. In some embodiments, for a thickness of the pad (e.g., between skin layers if present, or for the entirety of the cross-section of a pad) the pad may have a void volume fraction of between 10% and 97%; between 50% and 95%; or between 70% and 92%.

The thickness of the pad of the thermally conductive article is not particularly limited and is usually selected based on the size gap needed to be filled for a particular application of the article. Typically, the thickness of the pad is 0.1 millimeters (mm) or greater, 0.25 mm or greater, 0.50 mm or greater, 0.75 mm or greater, 1.0 mm or greater, 1.5 mm or greater, 2.0 mm or greater, 2.5 mm or greater, 5.0 mm or greater, 10.0 mm or greater, or 15.0 mm or greater; and 50 mm or less, 45 mm or less, 40 mm or less, 35 mm or less, 30 mm or less, 25 mm or less, or 20 mm or less.

The thermally conductive article preferably exhibits a thermal conductivity in a thickness direction (e.g., the thickness of the pad) of greater than 0.5 W/mK, 1 W/mK, 2 W/mK or greater, 3 W/mK or greater, 4 W/mK or greater, 5 W/mK or greater, 6 W/mK or greater, 7 W/mK or greater, or 8 W/mK or greater. Although the thermally conductive article is often preferred to exhibit maximum thermal conductivity, it typically exhibits a thermal conductivity in a thickness direction (e.g., the thickness of the pad) of 25 W/mK or less, 22 W/mK or less, 20 W/mK or less, 18 W/mK or less, 16 W/mK or less, 14 W/mK or less, 12 W/mK or less, or 10 W/mK or less. In some embodiments, the thermally conductive article exhibits a thermal conductivity in the thickness direction (e.g., the thickness of the pad) of between 0.5 and 25 W/mK, in some embodiments between 1 and 15 W/mK, and in some embodiments between 2 and 10 W/mK.

Compressibility may be a useful characteristic of thermally conductive articles according to the present disclosure. This is due to in part to variations in thickness of a gap required to be filled by the thermally conductive article and/or in part to changes in thickness of a gap during use of the thermally conductive article. In some embodiments, the thermally conductive article preferably exhibits 30% compression or greater at a pressure of up to 2 Megapascals (MPa), 40% or greater, 50% or greater, 60% or greater, or 70% or greater; and 80% compression or less at a pressure of up to 2 MPa.

The thermally conductive fibers for use in articles of the present disclosure are not particularly limited. Suitable materials of thermally conductive fibers include for instance and without limitation, copper, aluminum, steel, aluminum coated steel, iron, bronze, brass, nickel, chromium, gold, platinum, silver, palladium, rhodium, iridium, ruthenium, osmium, carbon, graphite, aluminum oxide, silicon carbide, boron nitride, ultrahigh molecular weight polyethylene, metal coated polymer fibers, thermally conductive particle filled polymer fibers, or combinations thereof. Typically, the thermally conductive fiber has a thermal conductivity of 5 W/mK or greater. In some embodiments, the thermally conductive fibers are metallic.

The nonwoven webs can be made from a breadth of fiber types including blends of polymeric and inorganic fibers to control the thermal conductivity and mechanical properties of the web. Optionally, the pad further comprises a plurality of second fibers entangled with the thermally conductive fibers. In some embodiments, the thermally conductive fibers are metallic (e.g., copper, aluminum, steel, nickel, silver, or metal coated polymer fibers) and the second fibers are polymeric or ceramic. Suitable polymeric fibers include for instance and without limitation, at least one of polyolefin fibers (e.g., polyethyelene or polypropylene), polyester fibers, or polyamide fibers. Further, phenolic (e.g., thermoset) fibers may be suitable polymeric fibers, may be potentially useful as a stiffening and/or springback additive for thermally conductive articles that will be subject to high levels of compression The polymer with which the pad is at least partially impregnated may be selected to provide effective binding of the thermally conductive fibers together. In many embodiments, the polymer has a glass transition temperature ($T_g$) of less than 20 degrees Celsius. Suitable polymers include for instance and without limitation, silicones, rubbers, polyolefins, and acrylates. Typically, the polymer is present as a coating on at least a portion of the entangled thermally conductive fibers. The web may further comprise a plurality of thermally conductive particles dispersed within the polymer to enhance thermal conductivity of the article. Suitable thermally conductive particles are described in detail below with respect to optional skin layers. The thermally conductive article is optionally further impregnated with a second polymer that is different from the first polymer and may be selected to provide one or more different characteristics to the final article, such as adhesiveness to other materials, spring back/mechanic response, etc. For instance, in an embodiment a first polymer may be used to bind the thermally conductive fibers together, and the second polymer may be used to add spring back, plus optionally one of the polymers could contain thermally conductive particles and/or flame retardant material.

Fiber dimensions are also changeable to tune the cohesiveness of the web to aid in processing. Suitable fiber lengths include an average length of 0.1 centimeters (cm) or greater, 0.2 cm or greater, 0.3 cm or greater, 0.4 cm or greater, 0.5 cm or greater, 0.6 cm or greater, 0.7 cm or greater, 0.8 cm or greater, 0.9 cm or greater, 1 cm or greater, 2 cm or greater, 3 cm or greater, or 4 cm or greater; and an average length of 10 cm or less, 9 cm or less, 8 cm or less, 7 cm or less, 6 cm or less, or 5 cm or less. Often, the thermally conductive fibers have an average diameter of 0.5 micrometers or greater, 1 micrometer or greater, 2 micrometers or greater, 5 micrometers or greater, 7 micrometers or greater, 10 micrometers or greater, 12 micrometers or greater, 15 micrometers or greater, 20 micrometers or greater, 25 micrometers or greater, 30 micrometers or greater, 40 micrometers or greater, 50 micrometers or greater, 60 micrometers or greater, 70 micrometers or greater, 80 micrometers or greater, or 90 micrometers or greater; and an average diameter of 250 micrometers or less, 225 micrometers or less, 200 micrometers or less, 175 micrometers or less, 150 micrometers or less, 125 micrometers or less, or 100 micrometers or less. The term "diameter" with respect to fibers refers to the average length of the largest dimension of the cross-section of the fiber. For instance, for a fiber having a rectangular cross-section, the diameter is the longest distance measurable along that cross-section. Average diameter and average length can be determined by viewing the diameter and the length, respectively, of 25 or more individual fibers under a microscope.

Figure 11:
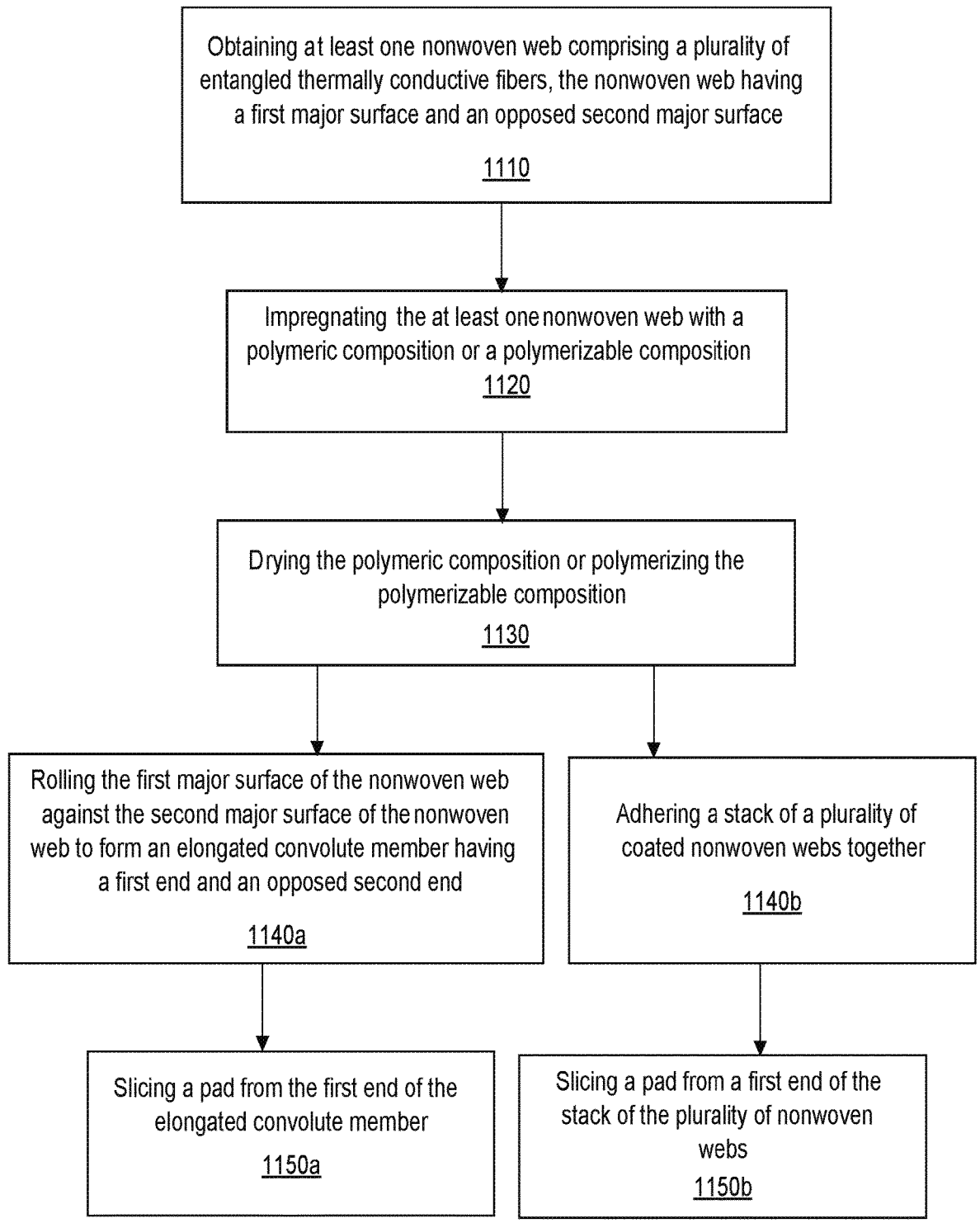
FIG. 11 is a flow chart of an exemplary method of making a thermally conductive article.

Referring to FIG. 11, a flow chart is provided of an exemplary method of making a thermally conductive article. More particularly, FIG. 11 includes the steps of obtaining at least one nonwoven web comprising a plurality of entangled thermally conductive fibers, the nonwoven web having a first major surface and an opposed second major surface 1110; impregnating the at least one nonwoven web with a polymeric composition or a polymerizable composition 1120; drying the polymeric composition or polymerizing the polymerizable composition 1130; and either rolling the first major surface of the nonwoven web against the second major surface of the nonwoven web to form an elongated convolute member having a first end and an opposed second end 1140a; and slicing a pad from the first end of the elongated convolute member 1150a; or 1140b adhering a stack of a plurality of coated nonwoven webs together; and slicing a pad from a first end of the stack of the plurality of nonwoven webs 1150b. The method optionally further comprises impregnating the nonwoven web(s) with a second polymer prior to forming an elongated convolute member, e.g., step d1 or step 1140a.

Obtaining the nonwoven web optionally comprises employing any suitable web-forming process with the thermally conductive fibers. Potentially suitable web-forming processes include for instance and without limitation, air-laying, wet-laying, carding, melt-spinning, melt-blowing, stitch-bonding, and so on. In some embodiments, a nonwoven web may be made by air-laying of staple fibers (as performed, e.g., by the use of a so-called Rando Webber apparatus, commercially available from Rando Machine Corporation, Macedon, N.Y.).

In some embodiments, a mass of thermally conductive fibers collected in web-forming process may be processed in any suitable manner to bond at least some fibers of the web to other fibers of the web. In specific embodiments, such fibers may include at least some bonding fibers, in which case the collection of fibers can be exposed to heat (whether by passing the collection of fibers through an oven or over a heated roll, or by subjecting the collection of fibers to so-called through-air bonding) and then cooled, to bond at least some fibers together. In such cases, it may be convenient to heat the fibers to a temperature that is near, or above, the melting point of the bonding fibers, but that is below the melting point of the (first) thermally conductive fibers, to perform such a bonding operation. Care should be taken to avoid causing large-scale melting of fibers and/or collapse of the fibrous structure of the nonwoven web. The nonwoven web has sufficient mechanical strength and integrity to be handled as a self-supporting fiber web or pad.

Often, the polymeric composition or the polymerizable composition comprises a low solids content composition at the time of application to the thermally conductive fibers of the nonwoven web. The composition is then dried or cured to remove essentially all the solvent of the composition and provide the polymer. For instance, the polymeric composition or the polymerizable composition may contain 2 weight percent (wt. %) or greater solids, based on the total weight of solvent and polymeric and polymerizable components in the polymeric or polymerizable composition, 3 wt. % or greater solids, 4 wt. % or greater solids, 5 wt. % or greater solids, 6 wt. % or greater solids, 7 wt. % or greater solids, 8 wt. % or greater solids, or 9 wt. % or greater solids; and 15 wt. % or less solids or less, based on the total weight of solvent and polymeric and polymerizable components in the polymeric or polymerizable composition, 14 wt. % or less solids, 13 wt. % or less solids, 12 wt. % or less solids, 11 wt. % or less solids, or 10 wt. % or less solids. For instance, the solids do not include any thermally conductive particles contained in the polymeric composition or the polymerizable composition.

In some embodiments, the method further comprises attaching a first skin layer attached to the first major surface of the pad, and optionally a second skin layer to the second major surface of the pad. The thermally conductive article may further comprise a first skin layer attached to the first major surface of the pad. Similarly, the thermally conductive article may further comprise a second skin layer attached to the second major surface of the pad. Advantageously, one or both of the optional skin layers may act as an adhesive layer, a fiber-encapsulating layer, a surface-wetting layer, or combinations thereof. The skin layer or layers and the thermally conductive fibers (e.g., the termini of thermally conductive fibers) may be interpenetrated. Furthermore, the thermally conductive fibers (e.g., the termini of the thermally conductive fibers) may fully penetrate the skin layer or layers so as to be present at one or both of the major surfaces of the article (e.g., thermally conductive pad), the major surface or surfaces of the article being defined in part by the skin layer or layers. Alternatively, the thermally conductive fibers (e.g., the termini of the thermally conductive fibers) may protrude past the skin layer or layers so as to be present at one or both of the major surfaces of the article (e.g., thermally conductive pad), the major surface or surfaces of the article being defined in part by the skin layer or layers.

Some suitable polymers for a skin layer include silicone, acrylate, polyurethane, elastomer, and rubber. In some embodiments, hot melt processable pressure sensitive adhesive compositions are suitable, such as, for example, acrylic adhesive, poly-alpha-olefin adhesive, a rubber based adhesive, a silicone adhesive, a blend of rubber based adhesive and acrylic adhesive, and combinations thereof, having a number average molecular weight of 25,000, as described in U.S. Pat. No. 7,229,683 (Fischer et al.). Further, suitable acrylates include for instance and without limitation, acrylic polymer components as described in U.S. Pat. No. 7,851,534 (Yoda et al.), U.S. Publication No. 2011/0245373 (Yoda), EP Publication No. 0566093 (Webb et al.), and/or U.S. Publication No. 2011/0031435 (Yoda et al.). Suitable silicones include, for example, organopolysiloxanes as described in U.S. Publication No. 2019/0292349 (Ito). Suitable two-component type polymers, such as a silicone gel or a urethane resin, plus a synthetic rubber resin and an acrylic thermoplastic resin, include those described in U.S. Pat. No. 6,794,030 (Okada et al.).

In some embodiments, a skin layer comprises thermally conductive particles distributed in the layer. Generally, any known thermally conductive fillers may be used, although electrically insulating fillers may be preferred where breakthrough voltage is a concern. Suitable electrically insulating, thermally conductive fillers include ceramics such as oxides, hydroxides, oxyhydroxides, silicates, borides, carbides, and nitrides. Suitable ceramic fillers include, e.g., silicon oxide, zinc oxide, aluminum oxide, aluminum hydroxide, aluminum trihydroxide (ATH), boron nitride (e.g., hexagonal boron nitride), silicon carbide, and beryllium oxide. Other thermally conducting fillers include carbon-based materials such as carbon nanotubes, graphene, and graphite, and metals such as aluminum and copper. The thermal conductivity of some representative inorganic materials is set forth in the following table.

| Thermally Conductive Materials | | | |
|---|---|---|---|
| Material | Thermal Conductivity (W/m*K) | Electronic Band Gap (eV) | Density |
| α-Aluminum Oxide | 30 | 5-9 | 3.95 g/cc |
| Alumina Trihydrate | 21 | | 2.42-2.45 g/cc |
| Silicon Carbide (SiC) | 120 | 2.4 | 3.21 g/cc |
| Hexagonal Boron Nitride (BN) | 185-300 | 2.1 | 2.1 g/cc |

In some embodiments, the thermally conductive particles comprise aluminum hydroxide particles that are obtained by a crystallization method and are not subjected to a pulverization treatment, for instance as described in U.S. Publication No. 2011/0245373 (Yoda). In some embodiments, the thermally conductive particles comprise a mixture of boron nitride particles, for instance as described in U.S. Publication No. 2018/0215964 (Wieneke et al.). In some embodiments, the thermally conductive particles comprise a mixture of aluminum nitride particles and crushed aluminum oxide particles, for instance as described in U.S. Publication No. 2019/0292349 (Ito). In some embodiments, the thermally conductive particles comprise a mixture of a metal oxide and a metal hydroxide (e.g., aluminum oxide mixed with aluminum hydroxide or magnesium hydroxide), for instance as described in U.S. Pat. No. 7,851,534 (Yoda et al.). In some embodiments, the thermally conductive particles comprise a mixture of combination of silicon carbide particles having a large particle diameter and boron nitride particles having a small particle diameter, for instance as described in U.S. Pat. No. 6,794,030 (Okada et al.).

In some embodiments, suitable thermally conductive particles comprise material(s) having a bulk thermal conductivity of at least 15 or 20 W/mK. In other embodiments, the thermally conductive particles comprise material(s) having a bulk thermal conductivity of at least 25 or 30 W/mK. In yet other embodiments, the thermally conductive particles comprise material(s) having a bulk thermal conductivity of at least 50, 75 or 100 W/mK. In yet other embodiments, the thermally conductive particles comprise material(s) having a bulk thermal conductivity of at least 150 W/mK. In typical embodiments, the thermally conductive particles comprise material(s) having a bulk thermal conductivity of no greater than about 350 or 300 W/mK.

The thermally conductive particles are optionally present in the polymeric composition or polymerizable composition in an amount of 40 wt. % or greater, based on the total weight of the polymeric composition or polymerizable composition, 45 wt. % or greater, 50 wt. % or greater, 55 wt. % or greater, 60 wt. % or greater, 65 wt. % or greater, 70 wt. % or greater, 75 wt. % or greater, or 80 wt. % or greater, based on the total weight of the polymeric composition or polymerizable composition; and 95 wt. % or less, based on the total weight of the polymeric composition or polymerizable composition, 90 wt. % or less, or 85 wt. % or less, based on the total weight of the polymeric composition or polymerizable composition.

In some embodiments, thermally conductive particles are present in an amount of 30 volume percent (vol. %) or greater, based on the total volume of the polymeric composition or polymerizable composition, 35 vol. % or greater, 40 vol. % or greater, 45 vol. % or greater; or 50 vol. % or greater; and 70 vol. % or less, based on the total volume of the polymeric composition or polymerizable composition, 65 vol. % or less, 60 vol. % or less, or 55 vol. % or less, based on the polymeric composition or polymerizable composition.

Thermally conductive particles are available in numerous shapes, e.g. spheres, irregular, platelike, & acicular. Through-plane thermal conductivity may be important in certain applications. Therefore, in some embodiments, generally symmetrical (e.g., spherical or semi-spherical) fillers may be employed. To facilitate dispersion and increase filler loading, in some embodiments, thermally conductive particles may be surface-treated or coated. Generally, any known surface treatments and coatings may be suitable, including those based on silane, titanate, zirconate, aluminate, and organic acid chemistries. For powder handling purposes, many fillers are available as polycrystalline agglomerates or aggregates with or without binder. Some embodiments may include mixtures of particles and agglomerates in various size and mixtures. Without intending to be bound by theory, it is surmised that including a sufficient amount of smaller particles of the proper particle size improves the thermal conductivity between the larger particles.

With regard to the smaller particles, at least 20, 25, 30, 35, 40, 45, 50 vol. % of the particles have a particle size no greater than 10 micrometers. In some embodiments, at least 10, 15, 20, 25 30, 35, 40, 45, 50, 55 or 60 vol. % of the particles have a particle size less than 5 micrometers. In some embodiments, at least 10% of the particles have a particle size less than 1 or 2 micrometers. In some embodiments, at least 20, 25, or 30 vol. % of the particles have a particle size less than 1 or 2 micrometers. In other embodiments, less than 10 vol. % of the particles have a particle size less than 1 or 2 micrometers.

With regard to the larger particles, at least 10, 15, 20, 25 or 30 vol. % of the particles have a particle size of at least 30, 40, or 50 micrometers. In some embodiments, the larger particles have a particle size of at least 55, 60, 65, 70, 75, 80, 85, 90 or 100 micrometers. The larger particles typically have a particle size of no greater than 200, 190, 180 micrometers. In some embodiments, the larger particles have a particle size of no greater than 170, 160, 150, 140 micrometers. In some embodiments, the larger thermally conductive particles have a particle size of no greater than 130, 120, 110 micrometers. In some embodiments, the larger thermally conductive particles have a particle size of no greater than 100, 90, 80 micrometers. In some embodiments, 5 vol. % of the particles have a particle size greater than 55, 60, 65, 70, 75, 80, 85, 90 or 100 micrometers. In some embodiments, 5 vol. % of the particles have a particle size greater than 110, 115, 120, 125, 130, 135, 140, 145, 150, 155, 160, 166, 170, 175, 180, or 185 micrometers.

Favorably the polymeric composition or polymerizable composition may comprise 10 by weight or greater, based on the total weight of the polymeric material, of inorganic filler having an average particle size of 30 micrometers or greater, 40 micrometers or greater, or 50 micrometers or greater.

The combination of smaller particles and larger particles can be obtained by selection of certain (e.g. commercially available) particles having at least a bimodal particle size distribution. The combination of smaller particles and larger particles can also be obtained by combining two or more (e.g. commercially available) particles having a normal particle size distribution, but sufficiently different median particles sizes.

Especially when the combination of particles is obtained by combining particles having a normal particle size distribution, but different median particles sizes; the particles further comprises particle having an intermediate particle size. Hence, the particles further comprise particles ranging from greater than 10 to less than 30 micrometers. The sum of the smaller particles (i.e. no greater than 10 micrometers), larger particles (at least 30 micrometers) and intermediate particles is typically 95, 96, 97, 98, 99, or 100% of the thermally conductive particles. The thermally conductive particles may optionally comprise 1, 2, 3, 4, or 5% of (e.g. extra-large) particles, having a particle size greater than 200 micrometers.

The particle size of the thermally conductive particle can be determined utilizing dynamic light scattering (DLS).

In typical embodiments, particle size refers to the "primary particle size", meaning the diameter of a single (non-aggregate, non-agglomerate) particle. The primary particles can form an "agglomerate", i.e. a weak association between primary particles which may be held together by charge or polarity and can be broken down into smaller entities. These weakly bound agglomerates would typically break down during high energy mixing processes. In some embodiments, the particle size may be the particle size of an aggregate, i.e. two or more primary particles bonded to each other. Depending on the viscosity and mixing technique, the aggregates may break down into smaller entities during mixing.

In methods in which a thermally conductive article is prepared having an array of pads (e.g., as shown in FIG. 7), the method of the second aspect further comprising constructing an array of the pads. This can involve placing a plurality of pads in a tiled array and banding them together.

In a third aspect, another thermally conductive article is provided. The thermally conductive article comprises a) a pad having first and second opposed major surfaces and a thickness therebetween; b) a first thermally conductive skin layer; and c) a second thermally conductive skin layer. The thickness of the pad is formed of a plurality of aligned thermally conductive fibers, and at least a portion of the thermally conductive fibers have a terminal end at the first opposed major surface and the opposed second major surface. The thermally conductive fibers have an average diameter of 0.5 micrometers to 500 micrometers. The first thermally conductive skin layer comprises a polymeric matrix at least partially embedded in the terminal end of at least a portion of the thermally conductive fibers at the first major surface of the pad. The second thermally conductive skin layer comprises a polymeric matrix at least partially embedded in the terminal end of at least a portion of the thermally conductive fibers at the second major surface of the pad.

In a fourth aspect, another method is provided. The method comprises a) aligning a plurality of thermally conductive fibers having a first terminal end, a length, and an opposing second terminal end; b) embedding a thermally conductive polymeric material or a thermally conductive polymerizable material in the first terminal end of at least a portion of the thermally conductive fibers; and c) drying the polymeric material or polymerizing the polymerizable material. The thermally conductive fibers have an average diameter of 0.5 micrometers to 500 micrometers and are aligned such that at least a portion of the lengths of the thermally conductive fibers are parallel ±20 degrees to each other.

The below disclosure relates to both the third and fourth aspects.

Figure 8:
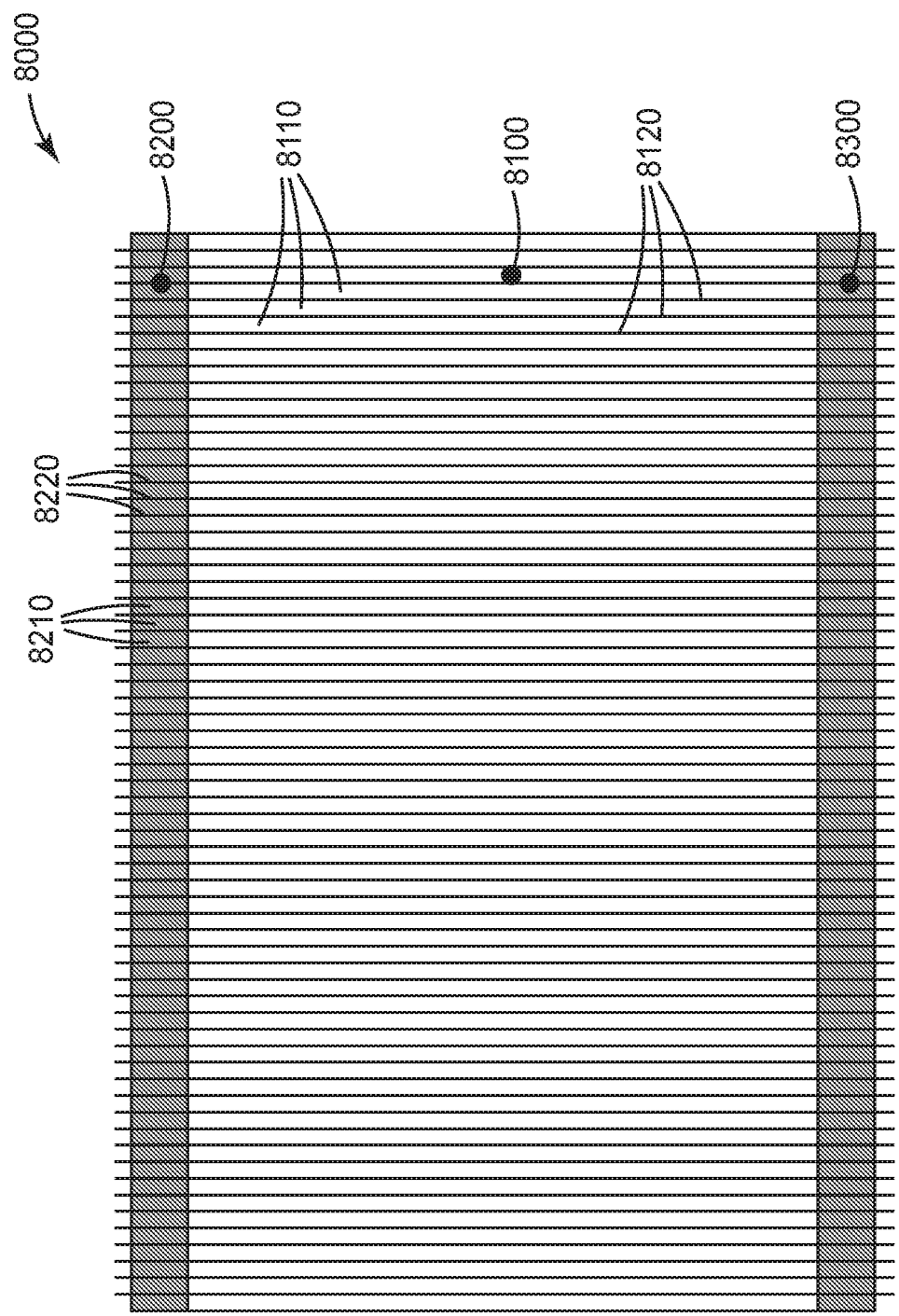
FIG. 8 is a schematic side view of an additional exemplary article, preparable according to the present disclosure.

Referring to FIG. 8, a schematic side view is provided of an exemplary article 8000. The thermally conductive article 8000 comprises a pad 8100 comprising a plurality of aligned thermally conductive fibers 8120. This embodiment also includes an optional binder 8110 disposed between the thermally conductive fibers 8120, contacting at least a portion of the aligned thermally conductive fibers 8120. In some embodiments, the binder 8110 is a thermally conductive polymer or composite material. In select embodiments, the thermally conductive binder 8110 is in the form of a foam.

Suitable binders and fillers include for instance and without limitation, all the polymeric and thermally conductive particle materials, respectively, described in detail above with for the skin layers with respect to the first aspect.

The thermally conductive article 8000 further comprises a first skin layer 8200 attached to a first major surface of the pad 8100. In the embodiment shown in FIG. 8, the aligned thermally conductive fiber 8220 optionally extend through the first skin layer 8200, providing increased thermal transport through the thickness (e.g., z-axis) of the thermally conductive article 8000. The first skin layer 8200 further comprises a polymeric material 8210, which often provides increased surface contact between the thermally conductive article 8000 and an article from which or two which heat is desired to be conducted. In the embodiment shown in FIG. 8, the thermally conductive article further optionally comprises a second skin layer 8300. The second skin layer may have the same composition as, or a different composition from, the first skin layer 8200. Optionally, at least one of the first skin layer and the second skin layer has a thickness of 0.1 millimeters (mm) or greater, 0.2 mm or greater, 0.3 mm or greater, 0.4 mm or greater, 0.5 mm or greater, or 0.6 mm or greater; and 1 mm or less, 0.9 mm or less, 0.8 mm or less, or 0.7 mm or less. Both of the first skin layer and the second skin layer may have a thickness in the same range (e.g., from 0.1 mm to 1 mm).

At least one of the first skin layer or the second skin layer preferably comprises a silicone, an epoxy, a polyether, an acrylate, or a polybutadiene. In some embodiments, the first skin layer comprises a composite material. Similarly, in some embodiments, the second skin layer comprises a composite material. Suitable thermally conductive particles to include in a composite material include for instance all the thermally conductive particles described above with respect to the first aspect.

Figure 9A:
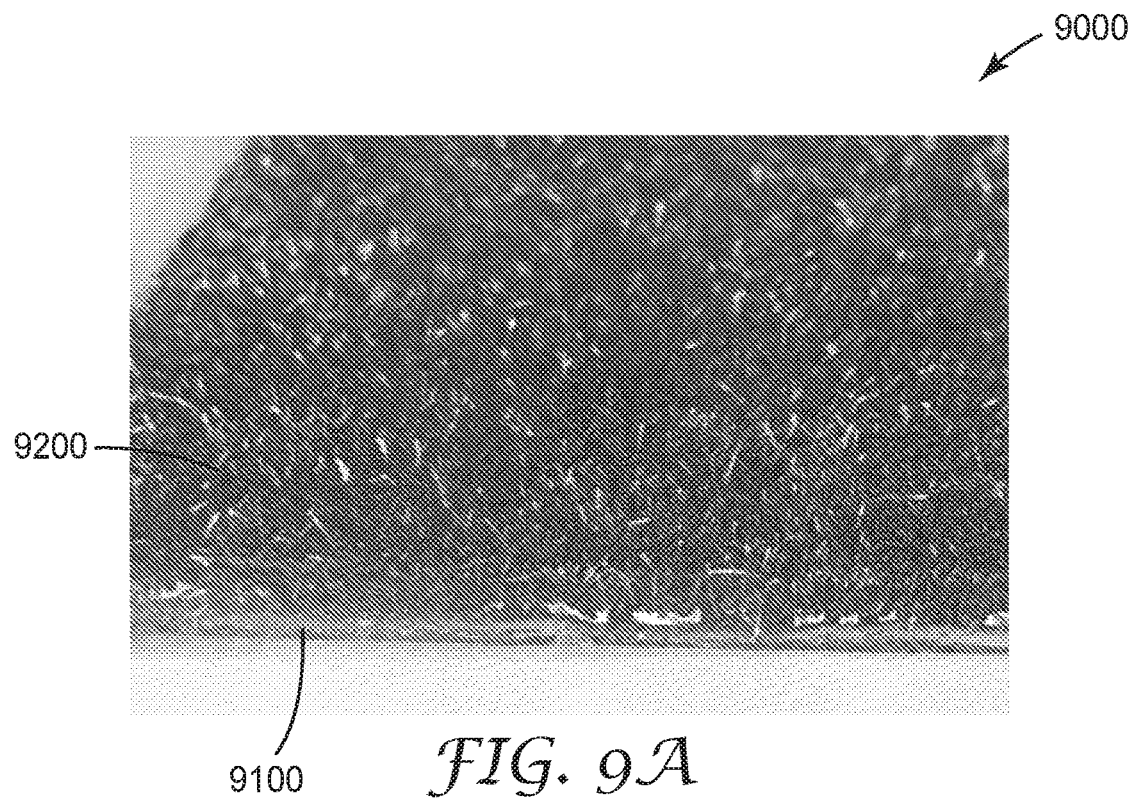
FIG. 9A is a photograph of another exemplary article, prepared according to the present disclosure.
Figure 9B:
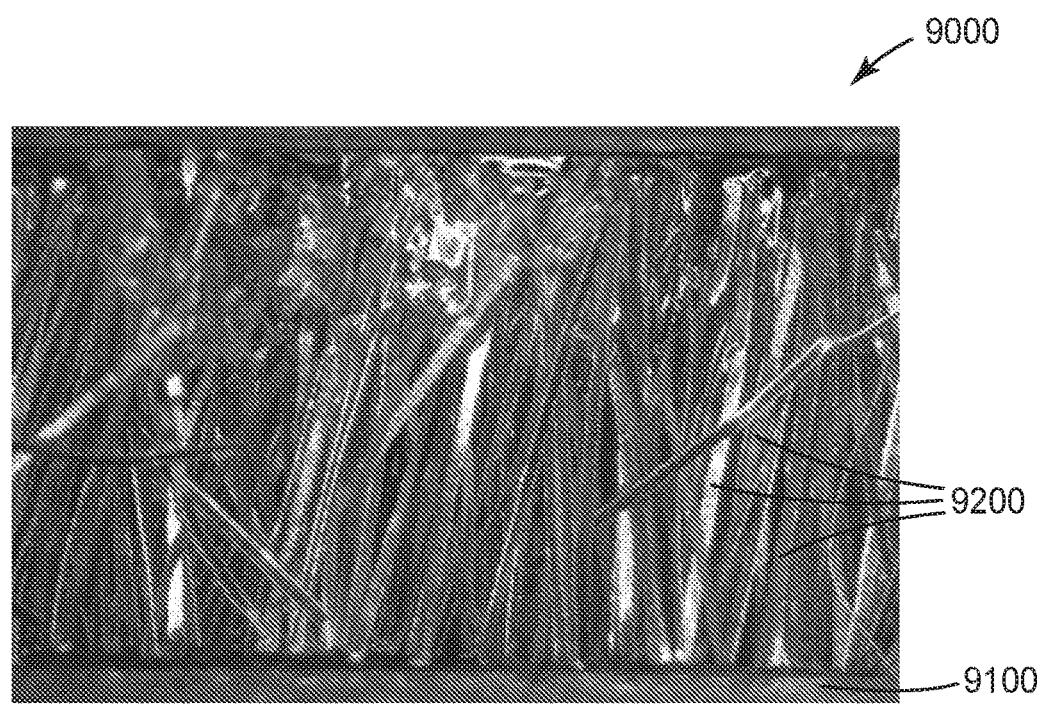
FIG. 9B is a photograph of the side of the article of FIG. 9A.

Referring to FIG. 9A, a photograph is provided of an exemplary thermally conductive article 9000 prepared according to the present disclosure. The article 9000 comprises an epoxy skin layer 9100 and a plurality of aligned copper fibers 9200 molded into the epoxy skin layer 9100. FIG. 9B is a photograph of the side of the article of FIG. 9A. The extent of alignment of the copper fibers 9200 can be seen in the FIG. B. Generally, the copper fibers 9200 are oriented within plus or minus 20 degrees of each other, with a few copper fibers 9200 outside of that range. If one or both ends of the fibers were to be curved, then at least 70% or at least 40%, respectively, of the (e.g., essentially straight) lengths of the fibers would be oriented within plus or minus 20 degrees of each other. In some embodiments, at least a portion of the thermally conductive fibers have lengths that are tilted at an angle up to 45 degrees from a first major surface of the thermally conductive article.

Figure 10A:
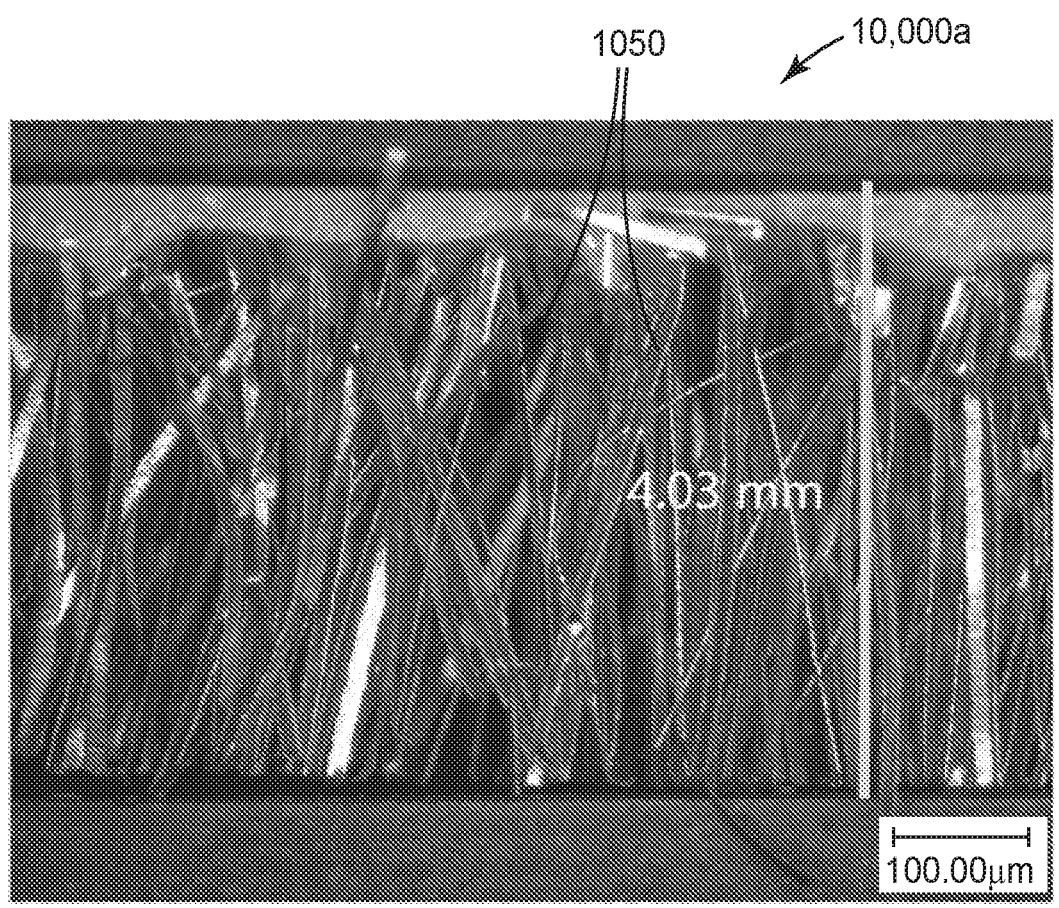
FIG. 10A is a photograph of the side of a further exemplary article, prepared according to the present disclosure.
Figure 10B:
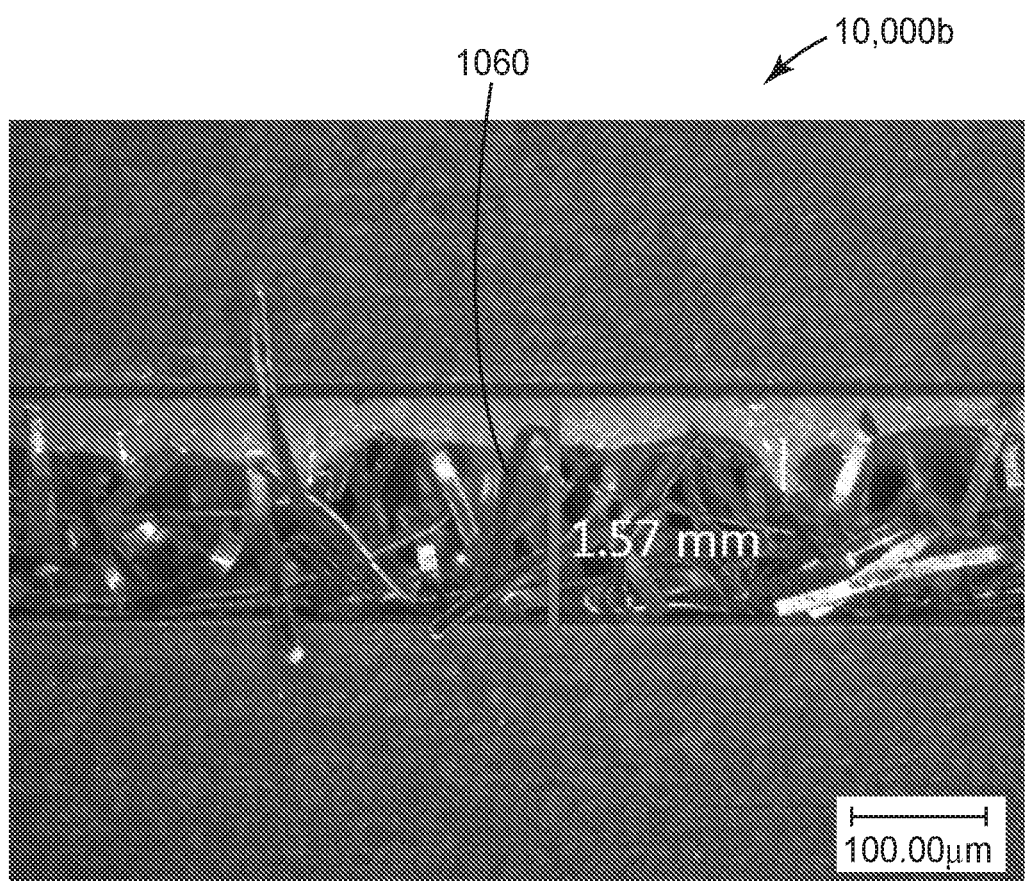
FIG. 10B is a photograph of the side of the article of FIG. 10A following compression in a vise.
Figure 10C:
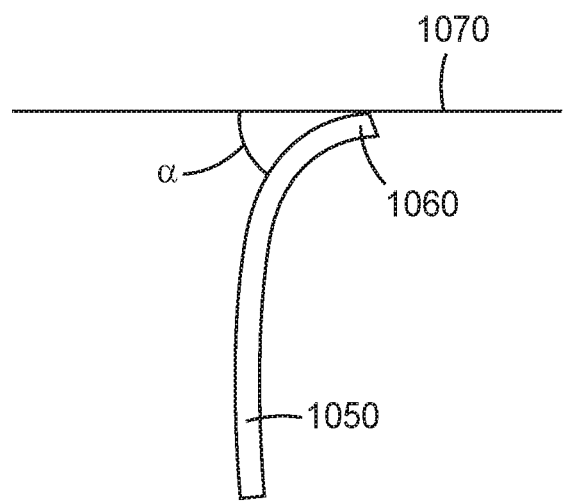
FIG. 10C is a schematic side view of a still further exemplary article, preparable according to the present disclosure.

Referring to FIG. 10A, a photograph is provided of a side of an exemplary thermally conductive article 10,000a, prepared according to the present disclosure. The copper fibers 1050 provide an article height of about 4 millimeters. FIG. 10B is a photograph of the side of the article of FIG. 10A following compression in a vise, in which the compressed thermally conductive article 10,000b has a height of less than 1.5 millimeters. The thermally conductive article 10,000a was compressed by approximately 60%. An advantage of compressing the thermally conductive article can be imparting a curve to at least a portion of the thermally conductive fibers, e.g., fiber 1060 in FIG. 10B. More generally, referring to FIG. 10C, a thermally conductive fiber 1050 is curved such that the last up to 10%, up to 20%, or up to 30% length of the fiber end 1060 points away from a main fiber length. For instance, the end of the fiber 1060 may form an angle alpha (α) with a plane orthogonal to the main fiber length of at least 45 degrees. Having curved ends can advantageously assist in preventing puncture of an article with which the thermally conductive article is in contact (e.g., a battery pack). In select embodiments of thermally conductive articles, at least a portion of the first terminal end or the second terminal end of the thermally conductive fibers is curved.

The pad of the thermally conductive articles according to this third aspect preferably provides a continuous thermally conductive path from a first major surface to an opposing second major surface.

The total average thickness of the thermally conductive article is not particularly limited, and may be 0.25 mm or greater, 0.5 mm or greater, 1.0 mm or greater, 1.5 mm or greater, 3 mm or greater, 5 mm or greater, or 10 mm or greater; and 20 mm or less, or 15 mm or less.

Suitable materials of thermally conductive fibers include for instance and without limitation, copper, aluminum, steel, aluminum coated steel, iron, bronze, brass, nickel, chromium, gold, platinum, silver, palladium, rhodium, iridium, ruthenium, osmium, carbon, graphite, aluminum oxide, silicon carbide, boron nitride, ultrahigh molecular weight polyethylene, metal coated polymer fibers, thermally conductive particle filled polymer fibers, polyethylene, poly-paraphenylene terephthalamide, or combinations thereof. In some embodiments, the thermally conductive fibers comprise copper, aluminum, steel, nickel, silver, aluminum oxide, silicon nitride, aluminum nitride, boron nitride, silicon carbide, carbon, graphite, ultra high molecular weight polyethylene, poly-paraphenylene terephthalamide, or combinations thereof.

Often, the thermally conductive fibers have an average diameter of 0.5 micrometers or greater, 1 micrometer or greater, 2 micrometers or greater, 5 micrometers or greater, 7 micrometers or greater, 10 micrometers or greater, 12 micrometers or greater, 15 micrometers or greater, 20 micrometers or greater, 25 micrometers or greater, 30 micrometers or greater, 40 micrometers or greater, 50 micrometers or greater, 60 micrometers or greater, 70 micrometers or greater, 80 micrometers or greater, or 90 micrometers or greater; and an average diameter of 500 micrometers or less, 400 micrometers or less, 300 micrometers or less, 200 micrometers or less, 150 micrometers or less, 125 micrometers or less, or 100 micrometers or less. In some embodiments, the thermally conductive fibers have an average diameter of 1 micrometer to 250 micrometers.

The thermally conductive article preferably exhibits a thermal conductivity in a thickness direction (e.g., the thickness of the pad) of greater than 1 W/mK, 2 W/mK or greater, 3 W/mK or greater, 4 W/mK or greater, 5 W/mK or greater, 6 W/mK or greater, 7 W/mK or greater, or 8 W/mK or greater; and a thermal conductivity of 25 W/mK or less, 22 W/mK or less, 20 W/mK or less, 18 W/mK or less, 16 W/mK or less, 14 W/mK or less, 12 W/mK or less, or 10 W/mK or less.

In some embodiments, the thermally conductive article preferably exhibits 30% compression or greater at a pressure of up to 2 Megapascals (MPa), 40% or greater, 50% or greater, 60% or greater, or 70% or greater; and 80% compression or less at a pressure of up to 2 MPa.

The thermally conductive article typically exhibits a density of less than 1.00 gram per cubic centimeter (g/cc), 0.90 g/cc or less, 0.80 g/cc or less, 0.70 g/cc or less, 0.60 g/cc or less, 0.50 g/cc or less, 0.40 g/cc or less, 0.30 g/cc or less, or 0.20 g/cc or less; and 0.05 g/cc or greater.

FIG. 12 is a flow chart of an exemplary method of making a thermally conductive article. More particularly, FIG. 12 includes the steps of aligning a plurality of thermally conductive fibers having a first terminal end, a length, and an opposing second terminal end and are aligned such that at least a portion of the lengths of the thermally conductive fibers are parallel ±20 degrees to each other 1210; embedding a thermally conductive polymeric material or a thermally conductive polymerizable material in the first terminal end of at least a portion of the thermally conductive fibers 1220; and drying the polymeric material or polymerizing the polymerizable material 1230. The method optionally includes embedding a thermally conductive polymeric material or a thermally conductive polymerizable material in the second terminal end of at least a portion of the thermally conductive fibers 1240; and drying the polymeric material or polymerizing the polymerizable material 1250.

The thermally conductive fibers are typically aligned using electrical charging, mechanical manipulation, or a combination thereof. Flocking processes are known in the art (for example, see U.S. Pat. No. 2,903,376 (Donahue); U.S. Pat. No. 6,286,246 (Rachal et al.); U.S. Publication No. 2004/117930 (Townley et al.); Journal of Materials Science: Materials in Electronics, Volume 30, pages 10233-10243 (2019); Advanced Materials, Volume 26, pages 5857-5862 (2014)); and Specialist yarn, woven and fabric structures: Developments and applications, Chapter 12 Flocked Fabrics and Structures, Publisher: Woodhead Publishing, Editors: R H Gong, pp. 287-317. One suitable method of aligning metallic fibers is described in the Examples below.

In a fifth aspect, the present disclosure provides a battery module. The battery module comprises the thermally conductive article according to any of the first aspect or the second aspect, as a gap filler.

Figure 13:
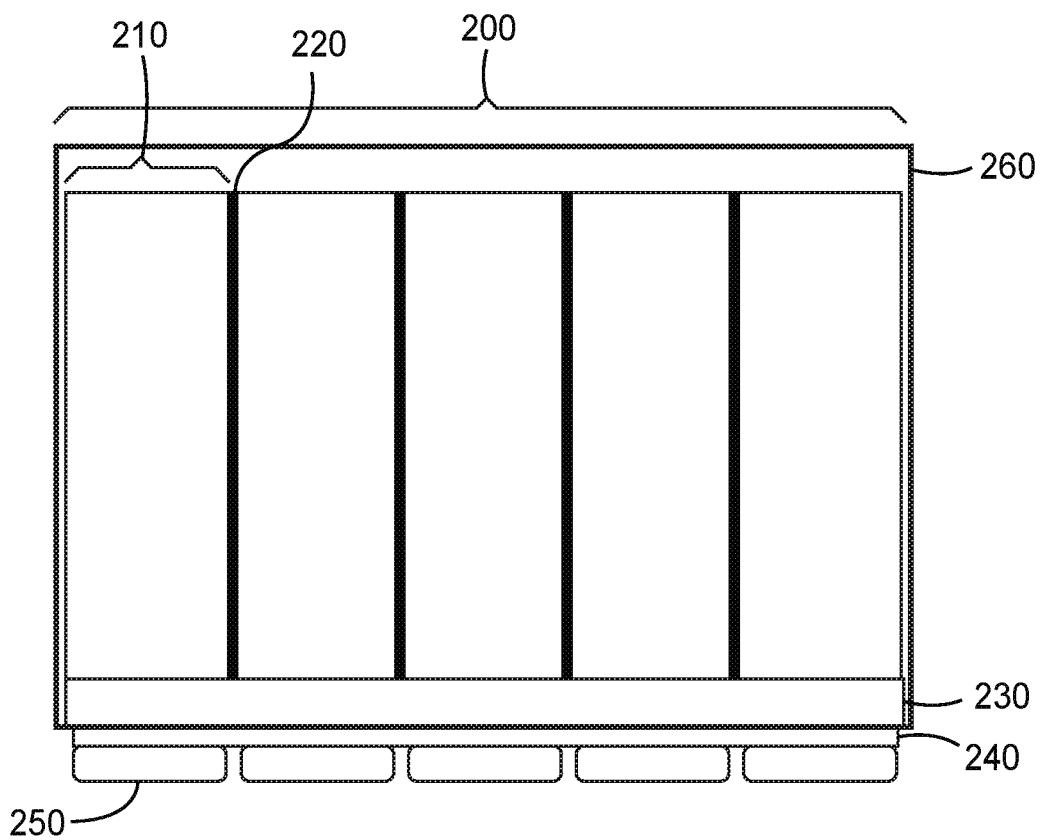
FIG. 13 is a schematic cross-sectional view of an exemplary battery module, preparable according to the present disclosure.

FIG. 13 is a schematic cross-sectional view of an exemplary battery module 200. The battery module 200 comprises at least one thermally conductive article 230 (e.g., as described herein) disposed in a battery trough and acting as a gap filler between a plurality of individual battery cells 210 and a cooling system 250. In the embodiment of FIG. 13, an optional system level thermally conductive article 240 (e.g., as described herein) is also included between the battery trough 260 and the cooling system 250. Further, the battery module 200 optionally includes at least one thermally conductive article 220 (e.g., as described herein) in between individual battery cells 210.

Other configurations of battery modules are possible, for instance including bus bar cooling, which has a TIM material additionally located at the top of the battery module, combined with a cooling system. In more simple versions, no liquid cooling is used, which would eliminate the use of the optional system level thermally conductive article 240 and the cooling system 250. Further, electrical insulation may be needed between battery cells and the trough, which could be provided of by an electrically insulating coating on the battery cells and/or the trough, or using thin electrically insulating films.

Assembled battery subunits may be combined to form further structures. For example, as is known, battery modules may be combined with other elements such as battery control units to form a battery system, e.g., battery systems used in electric vehicles. In some embodiments, thermally conductive articles according to the present disclosure may be used in the assembly of such battery systems. For example, in some embodiments, thermally conductive gap fillers according to the present disclosure may be used to mount and help cool the battery control unit.

Various embodiments are provided that include thermally conductive articles, battery modules, and methods of making thermally conductive articles.

In a first embodiment, the present disclosure provides a thermally conductive article. The thermally conductive article comprises a pad having first and second opposed major surfaces and a thickness therebetween. The thickness is formed of a plurality of entangled thermally conductive fibers and at least a portion of the entangled thermally conductive fibers have at least one terminal end at the first opposed major surface, the opposed second major surface, or both. The pad is at least partially impregnated with a polymer.

In a second embodiment, the present disclosure provides a thermally conductive article according to the first embodiment, wherein the thermally conductive fibers are metallic.

In a third embodiment, the present disclosure provides a thermally conductive article according to the first embodiment or the second embodiment, wherein the thermally conductive fiber has a thermal conductivity of at least 5 W/mK.

In a fourth embodiment, the present disclosure provides a thermally conductive article according to any of the first through third embodiments, wherein one or both of the first and second opposed major surfaces includes an areal density of fiber termini of at least 5 per square millimeter, at least 10, at least 15, or at least 20 per square millimeter.

In a fifth embodiment, the present disclosure provides a thermally conductive article according to any of the first through fourth embodiments, wherein the thickness has a void fraction of at least 10%, at least 20%, at least 30%, at least 40%, at least 50%, at least 60%, at least 70%, at least 80%, or at least 90%.

In a sixth embodiment, the present disclosure provides a thermally conductive article according to any of the first through fifth embodiments, wherein the pad is a convolute layer.

In a seventh embodiment, the present disclosure provides a thermally conductive article according to any of the first through fifth embodiments, wherein the pad is banded in a direction orthogonal to its thickness direction.

In an eighth embodiment, the present disclosure provides a thermally conductive article according to the sixth embodiment or the seventh embodiment, comprising an array of pads.

In a ninth embodiment, the present disclosure provides a thermally conductive article according to any of the first through eighth embodiments, wherein the thermally conductive fibers comprise copper, aluminum, steel, nickel, silver, carbon, graphite, aluminum oxide, silicon carbide, ultrahigh molecular weight polyethylene, or combinations thereof.

In a tenth embodiment, the present disclosure provides a thermally conductive article according to any of the first through ninth embodiments, wherein the fibers have an average diameter of 0.5 micrometers to 250 micrometers.

In an eleventh embodiment, the present disclosure provides a thermally conductive article according to any of the first through tenth embodiments, wherein the polymer has a glass transition temperature ($T_g$) of less than 20 degrees Celsius.

In a twelfth embodiment, the present disclosure provides a thermally conductive article according to any of the first through eleventh embodiments, wherein the pad further comprises a plurality of second fibers entangled with the thermally conductive fibers.

In a thirteenth embodiment, the present disclosure provides a thermally conductive article according to the twelfth embodiment, wherein the thermally conductive fibers are metallic and the second fibers are polymeric.

In a fourteenth embodiment, the present disclosure provides a thermally conductive article according to the twelfth embodiment or the thirteenth embodiment, wherein the polymeric fibers comprise at least one of polyolefin fibers, polyester fibers, or polyamide fibers.

In a fifteenth embodiment, the present disclosure provides a thermally conductive article according to any of the first through fourth embodiments, wherein the average thickness of the pad ranges from 0.1 millimeters to 50 millimeters.

In a sixteenth embodiment, the present disclosure provides a thermally conductive article according to any of the first through fifteenth embodiments, exhibiting a conductivity in a thickness direction of greater than 1 W/mK.

In a seventeenth embodiment, the present disclosure provides a thermally conductive article according to any of the first through sixteenth embodiments, exhibiting 50% to 80% compression at a pressure of up to 2 Megapascals (MPa).

In an eighteenth embodiment, the present disclosure provides a thermally conductive article according to any of the first through seventeenth embodiments, exhibiting a density of less than 1 gram per cubic centimeter (g/cc).

In a nineteenth embodiment, the present disclosure provides a thermally conductive article according to any of the first through eighteenth embodiments, wherein the pad provides a continuous thermally conductive path from the first major surface to the second major surface.

In a twentieth embodiment, the present disclosure provides a thermally conductive article according to any of the first through nineteenth embodiments, wherein at least a portion of the thermally conductive fibers have a terminal end at each of the first opposed major surface and the opposed second major surface of the pad.

In a twenty-first embodiment, the present disclosure provides a thermally conductive article according to the twentieth embodiment, wherein at least 25% of the thermally conductive fibers have terminal end at each of the first opposed major surface and the opposed second major surface of the pad.

In a twenty-second embodiment, the present disclosure provides a thermally conductive article according to any of the first through twenty-first embodiments, further comprising a plurality of thermally conductive particles dispersed within the polymer.

In a twenty-third embodiment, the present disclosure provides a thermally conductive article according to any of the first through twenty-second embodiments, further impregnated with a second polymer.

In a twenty-fourth embodiment, the present disclosure provides a thermally conductive article according to any of the first through twenty-third embodiments, further comprising a first skin layer attached to the first major surface of the pad.

In a twenty-fifth embodiment, the present disclosure provides a thermally conductive article according to any of the first through twenty-fourth embodiments, further comprising a second skin layer attached to the second major surface of the pad.

In a twenty-sixth embodiment, the present disclosure provides a thermally conductive article according to any of the first through twenty-fifth embodiments, wherein the polymer is present as a coating on at least a portion of the entangled thermally conductive fibers.

In a twenty-seventh embodiment, a method of making a thermally conductive article is provided. The method comprises a) obtaining at least one nonwoven web comprising a plurality of entangled thermally conductive fibers, the nonwoven web having a first major surface and an opposed second major surface; b) impregnating the at least one nonwoven web with a polymeric composition or a polymerizable composition; and c) drying the polymeric composition or polymerizing the polymerizable composition. The method further comprises either d1) rolling the first major surface of the nonwoven web against the second major surface of the nonwoven web to form an elongated convolute member having a first end and an opposed second end; and e1) slicing a pad from the first end of the elongated convolute member; or d2) adhering a stack of a plurality of coated nonwoven webs together; and e2) slicing a pad from a first end of the stack of the plurality of nonwoven webs. The method thereby forms a thermally conductive article according to the first aspect.

In a twenty-eighth embodiment, the present disclosure provides a method according to the twenty-seventh embodiment, wherein the nonwoven web further comprises a plurality of second fibers.

In a twenty-ninth embodiment, the present disclosure provides a method according to the twenty-seventh embodiment or the twenty-eighth embodiment, wherein the polymeric composition or the polymerizable composition comprises a 2 wt. % to 15 wt. % solids composition, based on the total weight of polymeric and polymerizable components and solvent in the composition.

In a thirtieth embodiment, the present disclosure provides a method according to any of the twenty-seventh through twenty-ninth embodiments, further comprising impregnating the entangled thermally conductive fibers with a second polymer prior to step d1).

In a thirty-first embodiment, the present disclosure provides a method according to any of the twenty-seventh through thirtieth embodiments, further comprising attaching a first skin layer to the first major surface of the pad.

In a thirty-second embodiment, the present disclosure provides a method according to any of the twenty-seventh through thirty-first embodiments, further comprising attaching a second skin layer to the second major surface of the pad.

In a thirty-third embodiment, the present disclosure provides a method according to any of the twenty-seventh through thirty-second embodiments, wherein the thermally conductive article is of any of the third through twenty-fifth embodiments.

In a thirty-fourth embodiment, the present disclosure provides a method according to any of the twenty-seventh through thirty-second embodiments, comprising constructing an array of the pads.

In a thirty-fifth embodiment, the present disclosure provides a thermally conductive article. The thermally conductive article comprises a) a pad having first and second opposed major surfaces and a thickness therebetween; b) a first thermally conductive skin layer; and c) a second thermally conductive skin layer. The thickness of the pad is formed of a plurality of aligned thermally conductive fibers, and at least a portion of the thermally conductive fibers have a terminal end at the first opposed major surface and the opposed second major surface. The thermally conductive fibers have an average diameter of 0.5 micrometers to 500 micrometers. The first thermally conductive skin layer comprises a polymeric matrix at least partially embedded in the terminal end of at least a portion of the thermally conductive fibers at the first major surface of the pad. The second thermally conductive skin layer comprises a polymeric matrix at least partially embedded in the terminal end of at least a portion of the thermally conductive fibers at the second major surface of the pad.

In a thirty-sixth embodiment, the present disclosure provides a thermally conductive article according to the thirty-fifth embodiment, wherein at least one of the first skin layer and the second skin layer have a thickness of 0.1 millimeters to 1 millimeter.

In a thirty-seventh embodiment, the present disclosure provides a thermally conductive article according to the thirty-fifth embodiment or the thirty-sixth embodiment, wherein both of the first skin layer and the second skin layer have a thickness of 0.1 millimeters to 1 millimeter.

In a thirty-eighth embodiment, the present disclosure provides a thermally conductive article according to any of the thirty-fifth through thirty-seventh embodiments, wherein the first skin layer comprises a composite material.

In a thirty-ninth embodiment, the present disclosure provides a thermally conductive article according to any of the thirty-fifth through thirty-eighth embodiments, wherein the second skin layer comprises a composite material.

In a fortieth embodiment, the present disclosure provides a thermally conductive article according to any of the thirty-fifth through thirty-ninth embodiments, wherein at least one of the first skin layer or the second skin layer comprises a silicone, an epoxy, a polyether, an acrylate, or a polybutadiene.

In a forty-first embodiment, the present disclosure provides a thermally conductive article according to any of the thirty-fifth through fortieth embodiments, having a total thickness of 0.25 millimeters to 20 millimeters.

In a forty-second embodiment, the present disclosure provides a thermally conductive article according to any of the thirty-fifth through forty-first embodiments, wherein the pad further comprises a thermally conductive binder contacting at least a portion of the aligned thermally conductive fibers.

In a forty-third embodiment, the present disclosure provides a thermally conductive article according to the forty-second embodiment, wherein the thermally conductive binder is in the form of a foam.

In a forty-fourth embodiment, the present disclosure provides a thermally conductive article according to any of the thirty-fifth through forty-third embodiments, wherein the thermally conductive fibers comprise copper, aluminum, steel, nickel, silver, aluminum oxide, silicon nitride, aluminum nitride, boron nitride, silicon carbide, carbon, graphite, ultra high molecular weight polyethylene, poly-paraphenylene terephthalamide, or combinations thereof.

In a forty-fifth embodiment, the present disclosure provides a thermally conductive article according to any of the thirty-fifth through forty-fourth embodiments, wherein the thermally conductive fibers have an average diameter of 1 micrometer to 250 micrometers.

In a forty-sixth embodiment, the present disclosure provides a thermally conductive article according to any of the thirty-fifth through forty-fifth embodiments, exhibiting a conductivity in the thickness direction of greater than 1 W/mK, greater than 2 W/mK, greater than 5 W/mK, or greater than 8 W/mK.

In a forty-seventh embodiment, the present disclosure provides a thermally conductive article according to any of the thirty-fifth through forty-sixth embodiments, exhibiting 30% to 80% compression at a pressure of up to 2 Megapascals (MPa).

In a forty-eighth embodiment, the present disclosure provides a thermally conductive article according to any of the thirty-fifth through forty-seventh embodiments, exhibiting a density of less than 1 gram per cubic centimeter (g/cc).

In a forty-ninth embodiment, the present disclosure provides a thermally conductive article according to any of the thirty-fifth through forty-eighth embodiments, wherein the pad provides a continuous thermally conductive path from the first major surface to the second major surface.

In a fiftieth embodiment, the present disclosure provides a battery module. The battery module comprises the thermally conductive article according to any of the first through twenty-sixth or thirty-fifth through forty-ninth embodiments, as a gap filler.

In a fifty-first embodiment, the present disclosure provides a method of making a thermally conductive article. The method comprises a) aligning a plurality of thermally conductive fibers having a first terminal end, a length, and an opposing second terminal end; b) embedding a thermally conductive polymeric material or a thermally conductive polymerizable material in the first terminal end of at least a portion of the thermally conductive fibers; and c) drying the polymeric material or polymerizing the polymerizable material. The thermally conductive fibers have an average diameter of 0.5 micrometers to 500 micrometers and are aligned such that at least a portion of the lengths of the thermally conductive fibers are parallel ±20 degrees to each other.

In a fifty-second embodiment, the present disclosure provides a method according to the fifty-first embodiment, further comprising f) embedding a thermally conductive polymeric material or a thermally conductive polymerizable material in the second terminal end of at least a portion of the thermally conductive fibers; and g) drying the polymeric material or polymerizing the polymerizable material.

In a fifty-third embodiment, the present disclosure provides a method according to the fifty-first embodiment or the fifty-second embodiment, wherein the plurality of thermally conductive fibers are aligned using electrical charging, mechanical manipulation, or a combination thereof.

In a fifty-fourth embodiment, the present disclosure provides a method according to any of the fifty-first through fifty-third embodiments, wherein the thermally conductive article is the article according to any of the thirty-fifth through forty-ninth embodiments.

In a fifty-fifth embodiment, the present disclosure provides a method according to any of the fifty-first through fifty-fourth embodiments, wherein at least a portion of the first terminal end or the second terminal end of the thermally conductive fibers is curved.

In a fifty-sixth embodiment, the present disclosure provides a method according to any of the fifty-first through fifty-fifth embodiments, wherein at least a portion of the thermally conductive fibers have lengths that are tilted at an angle up to 45 degrees from a first major surface of the thermally conductive article.

Examples

Unless otherwise noted or readily apparent from the context, all parts, percentages, ratios, etc. in the Examples and the rest of the specification were by weight.

The following abbreviations are used in this section: g=grams, in=inches, cm=centimeters, m=meters, mm=millimeters, mil=thousandths of an inch, wt. %=percent by weight, min=minutes, kN=kiloNewton, W=watts, ° C.=degrees Celsius, K=degrees Kelvin, RPM=revolutions per minute, MPa=megaPascals.

TABLE 1

Materials Used in the Examples

| Abbreviation | Description |
| --- | --- |
| Acrylate Adhesive | Poly(iso-octyl acrylate-co-acrylic acid), 90 wt. % iso-octyl acrylate, 10 wt. % acrylic acid from 3M, Cordova, IL |

TABLE 1-continued

Materials Used in the Examples

| Abbreviation | Description |
| --- | --- |
| Ethyl acetate | Available from Sigma-Aldrich |
| Aluminum fiber | Aluminum metal fiber, 0.003 in (7.6 mm) × 0.0009 in (2.3 mm) × 2 in (5 cm) (ribbon), available under the trade designation ANGELINA STAPLE FIBER from Meadowbrook Glitter, Bernardsville, NJ, USA |
| Copper Fiber A | Copper metal fiber, 17 denier × 1.3 in (7.6 cm), available under the trade designation ANGELINA from Meadowbrook Glitter |
| Polyester fiber | Low Melt Polyester Fiber, 4 denier, available under the trade designation LML41 from Stein Fibers, Albany, NY, USA |
| Copper Fiber B | Copper fibers with average length of 3.7 millimeters and average width of 0.12 millimeters, commercially obtained from Meadowbrook Inventions |
| Thermally Conductive Epoxy | Available under the trade designation 3M THERMALLY CONDUCTIVE EPOXY ADHESIVE TC-2810 from 3M Company, St. Paul, MN, USA |
| Two-part Epoxy | Available under the trade designation DEVCON 5 MINUTE EPOXY NO. 14250 from ITW Performance Polymers, Danvers, MA |
| Two-part Silicone | Available under the trade designation ECOFLEX 00-10 from Smooth-On, Inc., Easton, PA. |
| Thermal Grease | Available under the trade designation THERMAL JOINT COMPOUND, 120 SERIES from Wakefield Solutions Inc., NH, USA |

Test Methods

Measurement of Effective Thermal Conductivity: The effective thermal conductivity was determined following a modified procedure from ASTM-D5470 using a Thermal Interface Material Tester (Analysis Tech, Wakefield, MA). Samples of 33 mm in diameter were punched from Example and Counter Example pads and placed on the bottom plate of the TIM Tester. The top plate was slowly lowered into contact with the top surface of the sample. The top plate was heated, and bottom plate cooled until a temperature gradient was established with an average sample temperature of 50° C. and the effective thermal conductivity was calculated by dividing the thermal impedance by the sample thickness. Importantly, the reported value includes the contact resistance from the interface between each plate and the sample surfaces.

Measurement of Compressibility: Compressibility curves were collected using a test system available under the trade designation CRITERION C43 from MTS Systems, Eden Prairie, MN, USA, equipped with a 10 kN load cell and a 1 in (2.54 cm) radius stainless steel compression fixture. Samples were compressed at a rate of 100%/min. The compressibility of samples was compared as the stress of a specimen at 80% compression.

Measurement of Density: The pad density was determined by dividing the mass, obtained using an MS204S balance (Mettler Toledo, Columbus, OH), by the envelope volume, calculated from the pad diameter and height.

Measurement of Void Fraction: The void fraction is estimated by dividing the envelope pad density by the skeletal density of the coated nonwoven web and subtracting that value from one and multiplying by 100 to get a percent void fraction.

Example 1 (EX-1): A nonwoven web was made using a commercially available Rando Webber (Rando Machine Corporation). In this process, aluminum and polyester fibers were continuously fed at a weight ratio of 80:20 to the feed section of the machine in which they were tumbled using a spiked elevator. A vacuum roller pulled fibers from the feed section into a feed mat which was carried to the webber section of the machine. This feed mat was slowly fed into a lickerin spinning at 400 RPM. The lickerin grabbed individual fibers and threw them into an air stream which then collected onto a perforated drum. The web was then exposed to an oven at 146° C. for a total time of 1 min to melt the polyester and bind the web.

The nonwoven web was cut into strips of approximately 3 in (7.6 cm)×12 in (30.5 cm). Strips were immersed in a 3.4% solids solution of Acrylate Adhesive in ethyl acetate until saturated. Strips were then removed from solution and excess liquid was allowed to drain from the web before drying at room temperature. Strips were then rolled by hand along the long direction to form an elongated convolute member. 3 mm thick thermally conductive pads were sliced from the elongated convolute member along a plane perpendicular to the cylindrical axis of the elongated convolute member using an electric knife. The void fraction was estimated to be between 83% and 97%.

Example 2 (EX-2): EX-2 was prepared as described for EX-1, with the exception that the acrylate adhesive was a 2.9% solid solution in ethyl acetate. The void fraction was estimated to be between 80% and 97%.

Example 3 (EX-3): EX-3 was prepared as described for EX-1, with the exception that the acrylate adhesive was a 4.4% solid solution in ethyl acetate. The void fraction was estimated to be between 77% and 97%.

Example 4 (EX-4): EX-4 was prepared as described for EX-1, with the exception that Copper Fiber A and polyester fibers were continuously fed at a weight ratio of 80:20 to the feed section. The void fraction was estimated to be between 85% and 97%.

Example 5 (EX-5): EX-5 was prepared as described for EX-1, with the exception that Aluminum Fiber were continuously fed to the feed section and the web was not exposed to an oven. The void fraction was estimated to be between 78% and 97%.

Example 6 (EX-6): EX-6 was prepared as described for EX-1, with the exception that Copper Fibers A were continuously fed to the feed section and the web was not exposed to an oven. The void fraction was estimated to be between 84% and 97%.

Comparative Example 1 (CE-1): CE-1 was prepared following the description for EX-1, with the exception that samples for compression and thermal conductivity testing were cut from the coated web without rolling. The web had a thickness of approximately 0.077 in (0.2 cm).

TABLE 2

| Sample | Stress at 80% Compression (MPa) | Effective Thermal Conductivity (W m$^{-1}$ K$^{-1}$) | Density (g cm$^{-3}$) |
| --- | --- | --- | --- |
| EX-1 | 0.49 | 1.11 | 0.146 |
| EX-2 | 1.565 | 1.26 | 0.210 |
| EX-3 | 1.914 | 1.55 | 0.260 |
| EX-4 | 1.273 | 1.28 | 0.285 |
| EX-5 | 1.69 | 1.92 | 0.257 |
| EX-6 | 1.718 | 2.85 | 0.428 |
| CE-1 | 0.236 | 0.324 | 0.108 |

For Examples 7 through 9, (EX-7 through EX-9), thermally conductive articles comprising aligned metal fibers were fabricated by molding the fibers one-sided into a substrate layer, as follows. First, the Copper Fibers B were flocked on a transfer tape (Masking Tape, obtained from 3M Company, St. Paul, MN 55144 USA). Flocking processes are known in the art (for example, see U.S. Pat. No. 6,286,246 (Rachal et al.); U.S. Patent Publication No. 2004/117930 (Townley et al.); Journal of Materials Science: Materials in Electronics, Volume 30, pages 10233-10243 (2019); Advanced Materials, Volume 26, pages 5857-5862 (2014), and U.S. Pat. No. 2,903,376 (Donahue)). In this case, the technique used involved flocking the fibers onto the transfer tape through vibration of the transfer tape. The transfer tape and the fibers attached thereto as a result of the flocking was then inverted, with the free ends of the fibers embedded in a curable material ("skin layer"). The skin layer was formed by coating an uncured skin layer, of composition and thickness as indicated in Table 3, onto a release material. Aligned metal fibers were attached and partially embedded (to approximately 5 to 25% of their overall length) into the uncured skin layer. The skin layer was next cured to form a solid material, retaining the fibers after their separation from the transfer tape surface.

Examples 10 and 11 (EX-10 and EX-11) were prepared as described for EX-7, with the following additions. For EX-10 and EX-11, a coating layer material indicated in Table 3 was applied to the exposed ends of the metal fibers opposite to the first skin layer, penetrating the space between the fiber ends to approximately 5 to 25% of their overall length. The resulting thermally conductive articles comprised three layers: two skin layers at least partially penetrated with metal fibers that extend from the first skin layer to the second skin layer, the two solid material skin layers defining the two major surfaces of the pads, together with a core layer (i.e., a thermally conductive pad) comprising the metal fibers oriented preferentially in the direction between the major surfaces and separated within the core layer by void space (also referred to herein as pore space), the core layer extending for a thickness of approximately 50 to 90% of the overall length of the metal fibers (between the material outer layers). For EX-11, the two outer surfaces of skin layers were sanded manually following curing using a grit 400 sandpaper (obtained from 3M Company, St. Paul, MN, USA) until the ends of the fibers were clearly visible on the two surfaces.

Example EX-12 was prepared as described for EX-7, with the addition that the remaining space between the fibers was filled with Thermal Grease by coating the grease with a depressor, leaving an even surface and mostly filling the void space between the fibers.

Thermal conductivities for Examples EX-7 through EX-12 were measured according to the procedure described above. Results are recorded in Table 3.

TABLE 3

| Example | First Skin layer, thickness | Second Skin Layer | Effective thermal Conductivity (W m$^{-1}$ K$^{-1}$) |
| --- | --- | --- | --- |
| EX-7 | Thermally conductive epoxy, 50 mil (1.3 mm) | None | 2.8 |
| EX-8 | Two-part silicone, 110 mil (2.8 mm) | None | 2.7 |
| EX-9 | Two-part epoxy, 110 mil (2.8 mm) | None | 3.2 |
| EX-10 | Thermally conductive epoxy, 50 mil (1.3 mm) | Thermally conductive epoxy, 50 mil (1.3 mm) | 3.2 |
| EX-11 | Thermally conductive epoxy, 50 mil (1.3 mm), surface sanded | Thermally conductive epoxy, 50 mil (1.3 mm), surface sanded | 3.7 |
| EX-12 | Thermally conductive epoxy, 50 mil (1.3 mm) | Thermal grease | 3.6 |

TABLE 3-continued

Other modifications and variations to the present disclosure may be practiced by those of ordinary skill in the art, without departing from the spirit and scope of the present disclosure, which is more particularly set forth in the appended claims. It is understood that aspects of the various embodiments may be interchanged in whole or part or combined with other aspects of the various embodiments. All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. A thermally conductive article comprising a pad having first and second opposed major surfaces and a thickness therebetween, wherein the thickness is formed of a plurality of entangled thermally conductive fibers and at least a portion of the entangled thermally conductive fibers have at least one terminal end at the first opposed major surface, the opposed second major surface, or both; wherein the pad is at least partially impregnated with a polymer; and wherein the thickness has a void fraction of at least 10%, at least 20%, at least 30%, at least 40%, at least 50%, at least 60%, at least 70%, at least 80%, or at least 90%.

2. The thermally conductive article of claim 1, wherein one or both of the first and second opposed major surfaces includes an areal density of fiber termini of at least 5 per square millimeter, at least 10, at least 15, or at least 20 per square millimeter.

3. The thermally conductive article of claim 1, wherein the pad is a convolute layer.

4. The thermally conductive article of claim 1, wherein the pad is banded in a direction orthogonal to its thickness direction.

5. The thermally conductive article of claim 3, comprising an array of pads.

6. The thermally conductive article of claim 1, wherein the polymer has a glass transition temperature ($T_g$) of less than 20 degrees Celsius.

7. The thermally conductive article of claim 1, wherein the pad further comprises a plurality of second fibers entangled with the thermally conductive fibers.

8. The thermally conductive article of claim 1, exhibiting 50% to 80% compression at a pressure of up to 2 Megapascals (MPa).

9. The thermally conductive article of claim 1, wherein the pad provides a continuous thermally conductive path from the first major surface to the second major surface.

10. The thermally conductive article of claim 1, wherein at least a portion of the thermally conductive fibers have a terminal end at each of the first opposed major surface and the opposed second major surface of the pad.

11. A battery module comprising the thermally conductive article of claim 1 as a gap filler.

12. A method of making a thermally conductive article, the method comprising:
   a) obtaining at least one nonwoven web comprising a plurality of entangled thermally conductive fibers, the nonwoven web having a first major surface and an opposed second major surface;
   b) impregnating the at least one nonwoven web with a polymeric composition or a polymerizable composition;
   c) drying the polymeric composition or polymerizing the polymerizable composition; either
   d1) rolling the first major surface of the nonwoven web against the second major surface of the nonwoven web to form an elongated convolute member having a first end and an opposed second end; and
   e1) slicing a pad from the first end of the elongated convolute member; or
   d2) adhering a stack of a plurality of coated nonwoven webs together; and
   e2) slicing a pad from a first end of the stack of the plurality of nonwoven webs,
thereby forming a thermally conductive article comprising a pad having first and second opposed major surfaces and a thickness therebetween, wherein the thickness is formed of a plurality of entangled thermally conductive fibers and at least a portion of the entangled thermally conductive fibers have at least one terminal end at the first opposed major surface, the opposed second major surface, or both; wherein the pad is at least partially impregnated with a polymer; and wherein the thickness has a void fraction of at least 10%, at least 20%, at least 30%, at least 40%, at least 50%, at least 60%, at least 70%, at least 80%, or at least 90%.

* * * * *